United States Patent [19]
Goyal et al.

[11] Patent Number: 5,625,575
[45] Date of Patent: Apr. 29, 1997

[54] APPARATUS FOR MODELLING INTERACTION OF RIGID BODIES

[75] Inventors: Suresh Goyal, Chatham; Elliot N. Pinson, Watchung; Frank W. Sinden, Princeton, all of N.J.

[73] Assignee: Lucent Technologies Inc., Murray Hill, N.J.

[21] Appl. No.: 100,906

[22] Filed: Aug. 3, 1993

[51] Int. Cl.[6] ................................................. G06F 17/00
[52] U.S. Cl. ................................................. 364/578
[58] Field of Search ................................. 364/578, 806, 364/512, 524

[56] References Cited

PUBLICATIONS

C. R. Walton, "Numerical Simulation of Inelastic, Frictional Particle—Particle Interactions", *Particulate Two-Phase Flow*, Chapter 25, edited by M. C. Roco, Butterworth–Heinemann, Boston 1992.

O. R. Walton, "Description of DIBS (Discrete Interacting Block System) Movie", Lawrence Livermore Laboratory, LLNL Technical Photo Print No. 1470), UCID–19804, May 1983.

P. A. Cundall, "Formulation of a Three-dimensional Distinct Element Model—Part I. A Scheme to Detect and Represent Contacts in a System Composed of Many Polyhedral Blocks", *Int. J. Rock Mech. Min. Sci. & Geomech. Abstr.*, vol. 25, No. 3, pp. 107–116, 1988.

R. Hart, P. A. Cundall, J. Lemos, "Formulation of a Three–Dimensional Distinct Element Model—Part II. Mechanical Calculations for Motion and Interaction of a System Composed of Many Polyhedral Blocks", *Int. J. Rock Mech. Min. Sci. & Goemech. Abstr.*, vol. 25, No. 3, pp. 117–125, 1988.

P. A. Cundall and O. K. L. Strack, "A Discrete Numerical Model for Granular Assemblies", *Geotechnique*, vol. 29, No. 1, 47–65 (1979).

*Primary Examiner*—Ellis B. Ramirez
*Attorney, Agent, or Firm*—Gordon E. Nelson

[57] ABSTRACT

Apparatus for modelling or simulating the dynamics of interacting rigid bodies. In the apparatus, the rigid bodies are represented as convex polyhedra. Contacts between the bodies are modelled as contacts between a face and a vertex or between edges. All other types of contact are reduced to these types. The beginning or end of a contact is determined by means of linear interpolation. The dynamics of the contacts are modelled as contacts between massless rigid surface elements which are connected by massless viscous layers to the objects. The viscous layer connecting a surface element to its object permits the surface element to move either perpendicular to or tangent to the plane of contact. The properties of the viscous layers determine the dynamics of the contacts. In the implementation, the properties are described by means of two systems of springs and dampers, one permitting motion in the perpendicular direction and the other motion in the tangential direction. Parameters of the spring and damper systems may be set as required to model contacts between various kinds of objects.

9 Claims, 8 Drawing Sheets

FIG. 12

$D_0$  DYNAMIC STATE AT TIME $t_0$, THE START OF AN INTEGRATION STEP
$C_0$  CONTACT STATE AT TIME $t_0$ BASED ON $D_0$
$E_0$  DYNAMICS EQUATIONS (DETERMINED BY $C_0$)
$D_1$  PROPOSED DYNAMIC STATE AFTER INTEGRATING FORWARD TO TIME $t_1 = t + dt_0$
$C_1$  PROPOSED CONTACT STATE AT TIME $t$ BASED ON $D$
$\delta$  FRACTION OF STEP SIZE $dt$ AT WHICH FIRST NEW CONTACT OCCURS (-1 IF NO NEW CONTACTS)
$D_c$  DYNAMIC STATE AFTER INTEGRATING FORWARD TO TIME OF FIRST NEW CONTACT, $t_c = t_0 + \delta \cdot dt$
$C_c$  CONTACT STATE AT TIME $t_c$ BASED ON $D_c$

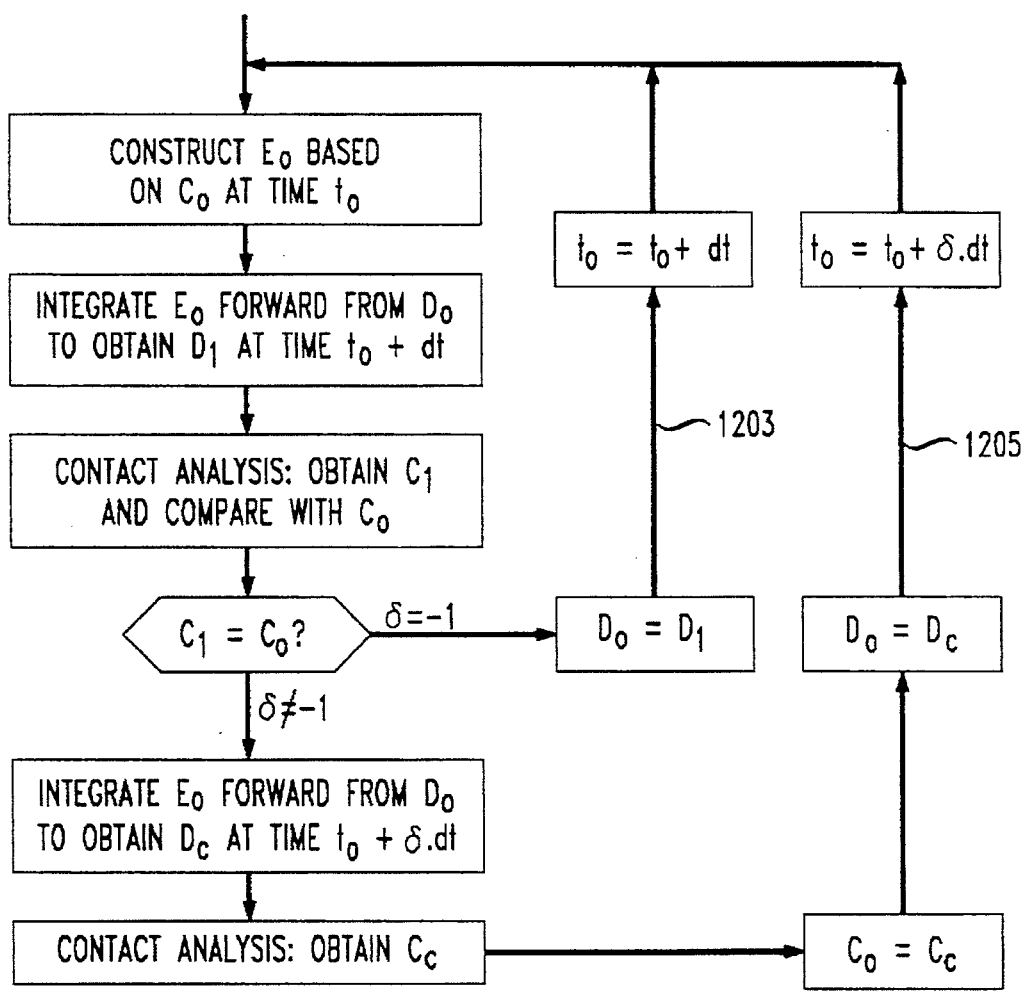

VERTEX-FACE POSITION AT START OF
INTEGRATION INTERVAL, $t = t_1$

VERTEX-FACE POSITION AT CONTACT, $t = t_c$

VERTEX-FACE POSITION AT END OF
INTEGRATION INTERVAL, $t = t_2$

POTENTIAL CHANGE OF CONTACTED FACE

BREAK OF VERTEX-FACE CONTACT REQUIRED

APPARATUS FOR MODELLING INTERACTION OF RIGID BODIES

BACKGROUND OF THE INVENTION

1. Field of the Invention

The invention pertains to modelling and simulation generally and in particular to the modelling of the interaction of rigid bodies.

2. Description of the Prior Art

One use of computers is to develop systems which model the physical world. Such systems provide electronic laboratories for a variety of applications. For example,

- As an integral part of *Software Prototyping*, i.e. the building and verification of electro-mechanical product designs on the computer (CAD/CAM).
- Simulation of automatic assembly operations that might also involve relative sliding of the mating parts.
- The design of automatic parts orienting machines and strategies.
- As a testbed for verifying control strategies for robotic and other physical systems. For designing walking, hopping and other mobile robots; and for simulating various kinds of robotic activity.
- Simulation of activity in hazardous and exotic environments like in deep sea, in space, or on other planetary bodies.
- For studying behavior of granular assemblies and granular flow.
- For studying rock mechanics, avalanches and other geological activity, building stability, and the effects of explosions on structures.
- In Biomechanics and safety studies, especially for vehicle crash simulation.
- As an educational tool for building insight into dynamical systems, whose behavior can sometimes be quite counter-intuitive. For example, motion due to gyroscopic loads, effects of friction, etc.
- Modeling molecular interactions.
- Realistic animation for computer graphics and entertainment.
- For building a computer model of the physical world that a 'user' could interact with using sensory interfaces, commonly known as virtual reality.

A common thread in all these applications is the need for realistic and efficient modelling of the contact between objects. An additional, anthropocentric, reason for modeling such contact is its importance in human tactile activity (touching, rubbing, grasping, etc.). Similarly, the correct incorporation of contact loads in feedback control algorithms can be a critical element for autonomous robots and automatic parts orienting machinery.

Contact between bodies can occur in two situations. The bodies may be constrained together in the form of a joint or mechanism. Or they may interact through collisions (impacts) and sustained gentler contacts. Classically, an impact between a pair of bodies is modeled as a phenomenon with instantaneous transfer of momentum and energy. Sustained contact occurs when bodies remain in stationary contact or slide or roll along each other.

Of the two kinds of physical interactions cited above, mechanisms are easier to model because the motion resulting due to a joint (or hinge) is translatable into holonomic constraints that can be generated automatically and incorporated into the equations of motion. On the other hand, modeling arbitrary impacts and/or sustained contact is difficult because of: (a) the lack of a concise theory for three-dimensional (3-D) impact with friction, (b) complex nonholonomic constraints associated with the motion of bodies that move while maintaining contact, the time discontinuity of these constraints, and, (c) issues related to friction.

Given inertial properties (masses and moments of inertia) and external loads (forces and moments), the problem of simulating motion of interacting bodies reduces to the correct determination of contact loads, or equivalently, efficient computation of 'contact mechanics'. In this context, contact mechanics divides into two parts: the geometric part that deals with the detection of contact between objects and the dynamics part that deals with the estimation of forces at these contacts. The first step in the calculation of contact forces involving formulation of a contact model.

In full detail, the interaction between bodies during contact is a complex phenomenon that involves local deformations and acoustic waves propagation throughout the bodies, fracture, dissipation of energy through internal friction and heat, plastic deformation, sound, and other mechanisms. There does not exist any complete and elegant formulation to describe this phenomenon in its entirety. All practical models use some idealized approximation to the actual contact phenomenon. Classical contact models were designed to avoid the need for tedious calculation such as that requiring numerical integration. The price of this avoidance was suppressed detail, reliance on parameters such as the coefficient of restitution that did not always correspond well to material constants, and a proliferation into cases. But with the advent of high speed computers, computation intensive models have also become feasible.

From a computational viewpoint, an important criterion for evaluating contact models is their time complexity in estimating forces. This includes the computation required for detecting and analyzing contact and that required for calculating forces. In fact, computational complexity is the main limiting factor in determining the 'size' of the problem that can be simulated in reasonable time. Consequently, the prior art has had to trade off between detail (essential for an accurate simulation) and speed. It is an object of the invention disclosed herein to provide modelling apparatus which gives a better trade-off between detail and speed than has been available heretofore.

SUMMARY OF THE INVENTION

The modelling system disclosed herein employs an idealization of deformation and friction which is simple enough to make the computation fast, yet rich enough to permit the simulation of a wide variety of contact behaviors. The idealization involves rigid massless surface elements at the points of contact which have a viscous deformable layer between them and the actual object. The properties of the viscous deformable layer determine the contact behavior of the objects. The model does not have the combinatorial complexity associated with the quadratic program in the traditional approach, nor does it require different formulations for treating impacts and sustained contacts. The model further explicitly includes the effects of friction (which prior-art systems have not adequately treated) and energy loss during impact, and contains parameters (coefficient of friction, spring and damper coefficients) that can be related to measureable properties of real materials and impact events (e.g., Young's modulus and the coefficient of restitution).

Since the model treats all contacts as having a finite duration and also allows multiple simultaneous contacts, it permits detailed examination of the time varying dynamic loads that occur during complex impacts. This is a very useful feature for purposes of analysis and mechanical design and one which is not available in modelling systems which apply the traditional approach of modeling impacts singly through instantaneous momentum impulses.

Other objects and advantages of the apparatus and methods disclosed herein will be apparent to those of ordinary skill in the art upon perusal of the following Drawing and Detailed Description, wherein:

BRIEF DESCRIPTION OF THE DRAWING

FIG. 12 is a detailed flow chart of a part of the geometry module;

Figure 1:
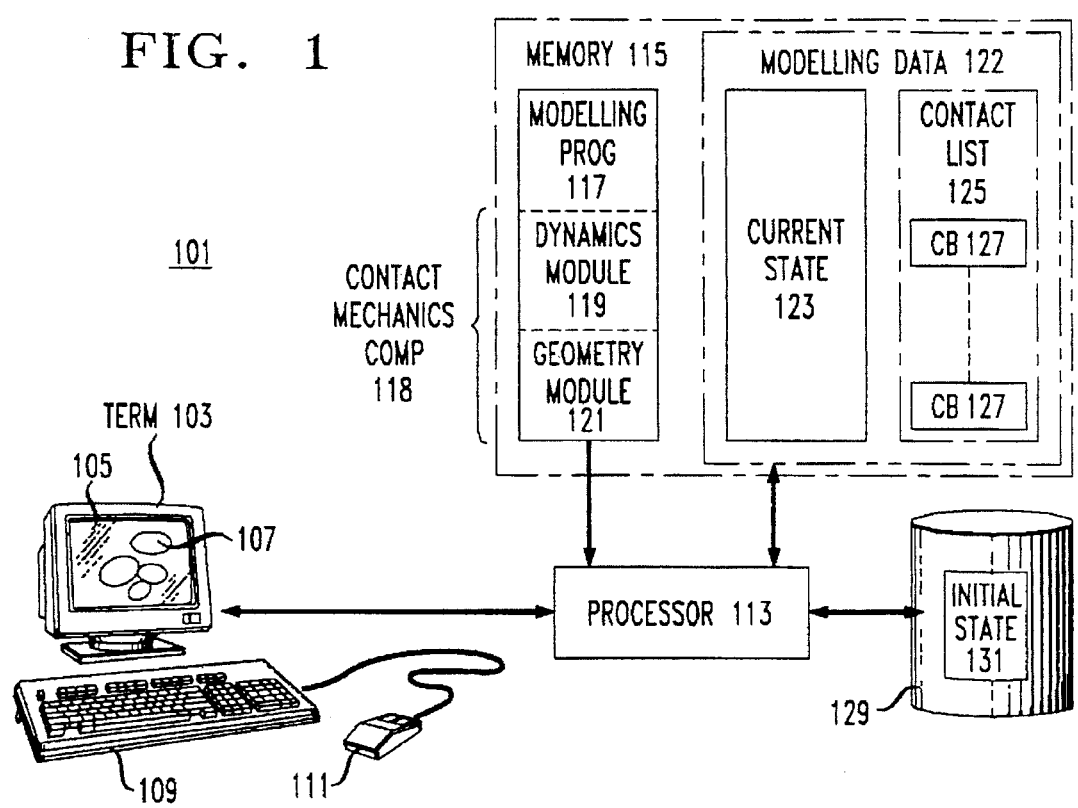
FIG. 1 is a block diagram of a modelling system embodying the invention.

Reference numbers in the Drawing have two parts: the two least-significant digits are the number of an item in a figure; the remaining digits are the number of the figure in which the item first appears. Thus, an item with the reference number 201 first appears in FIG. 2.

DETAILED DESCRIPTION OF A PREFERRED EMBODIMENT

The following Detailed Description first provides an overview of a modelling system embodying the invention, continues with a theoretical discussion of the problem of modelling a system of rigid bodies and of the model employed in the invention and then provides a detailed disclosure of the modelling system.

Overview of a Modelling System: FIG. 1

FIG. 1 is a block diagram of a modelling system 101 embodying the invention. The major components of modelling system 101 are processor 113, which is a high-performance digital data processor which is particularly adapted for driving graphics displays, terminal 103, an interactive graphics display terminal which includes screen 105, keyboard 109, and pointing device 111, memory 115, which contains programs executed by processor 113 and data upon which the processor operates, and disk drive 129, which contains files.

The components of FIG. 1 become modelling system 101 when processor 113 executes modelling program 117 in memory 115 on modelling data 122 in that memory and uses modelling data 122 to produce a display 107 of objects interacting on screen 105. Operation is as follows: at the beginning of execution of modelling program 117, the contents of a file 131 containing a description of the initial state of the system of objects being modelled is read from disk drive 129 into current state 123 in memory 122. Modelling program 117 then begins modelling the further motion of the system of objects, updating current state 123 as it determines the further motion. The modified current state 123 is then used to produce display 107, which of course changes as current state 123 changes.

In system 101, modelling program 117 includes contact mechanics component 118, which performs the computations necessary to model the effect of contact among objects in the system on the further motion of the system. Contact mechanics component 118 in turn includes a geometry module 121 which models the shape, mass, and inertial attributes of each object and a dynamics module that formulates the governing equations for the system of objects, estimates the contact forces and other loads based on information provided by the geometry module, and integrates the equations of motion to systematically update current state 123. As will be described in more detail later, the objects in the system are modelled as convex polyhedra. Contact between the objects consequently involves vertices, edges, and faces of the polyhedra. Contact list 125 in modelling data 122 contains a contact block 127 for each contact between the objects in the system, and the data in contact block 127 is used and modified by both dynamics module 119 and geometry module 121.

The General Problem and the Contact Model

Figure 2:
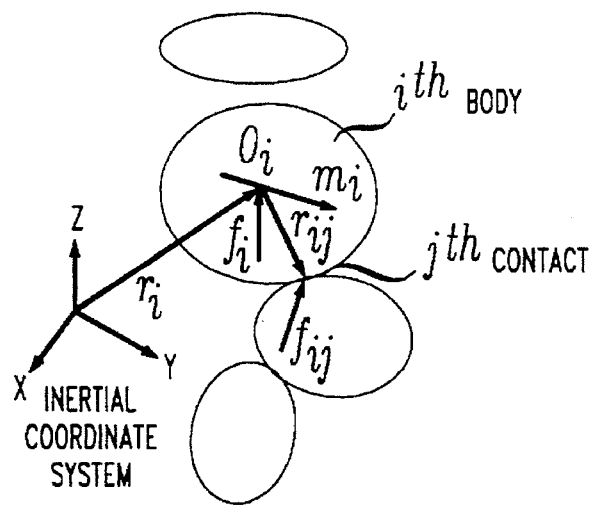
FIG. 2 is a diagram of a system of objects of the type modelled by the modelling system.

Given a set of initial conditions, the basic aim of our modelling system is to be able to determine the state (positions, velocities) of a system of rigid bodies, represented schematically in FIG. 2 at any time. The governing mathematics consists of equations of motion and a contact model. The contact model depends on the solution approach followed for evaluating contacts whereas the equations of motion do not. There are two approaches for estimating contact forces:

(a) The traditional hard contact approach that suppresses the details of deformation at contact and assumes bodies to be infinitely rigid. Contact forces are calculated as those that would be necessary to prevent inter-penetration of the bodies. Forces may be infinite with this method, but impulses (the time integral of force) are not.

(b) The soft contact approach, with roots in the Hertzian theory of contact, where the contacting bodies are modeled as deforming locally in the neighborhood of a contact. This deformation, in conjunction with material stiffness parameters, is used to estimate contact forces. For details on the Hertzian theory of contact, see Goldsmith, W., *Impact: The Theory and Physical Behaviour of Colliding Solids*, Arnold, 1960.

The modelling apparatus disclosed herein employs the soft contact approach and thereby alleviates some of the problems associated with the hard contact approach. Most notably, it does not distinguish between impacts and other contacts and solution therefore proceeds without branching into different cases. There is no further restriction on the motion of the objects during contact. Finite forces are calculated at all contacts through a force-deformation model that incorporates material properties and allows nonpermanent local deformation of the bodies in the vicinity of contact.

Equations of Motion

We use the Newton-Euler equations of motion for the systems of FIG. 2. Lower case bold letters stand for vectors, lower case italic letters stand for scalars or vector components, and upper case bold letters represent tensors and matrices. The system of n bodies is indexed by i and the m contacts between them are indexed globally by j. Body i, with mass $m_i$ and angular velocity $\omega_i$ has its center of mass at $O_i$, which is located at $r_i$ from the origin of an inertial coordinate system. Also for body i, $J_i$ is the mass moment of inertia matrix with respect to a body fixed coordinate system at $O_i$, $f_i$ is the resultant of all external forces (except contact forces) acting on the body at $O_i$, $m_i$ is the resultant of all external moments (except moments of the contact forces) at $O_i$, $f_{ij}$ is the force acting at contact j at $r_{ij}$ from $O_i$ (see FIG. 2), and $() = d()/dt$.

The equations of motion are:

$$m_i \ddot{r}_i = f_i + \sum_{j=1}^{m} f_{ij} \quad (1)$$

$$J_i \dot{\omega}_i + \omega_i \times (\omega_i \times r_i) = m_i + \sum_{j=1}^{m} r_{ij} \times f_{ij}$$

In our notation, $f_{ij}$ is zero if contact j does not involve body i.

Given the set of object geometries and initial conditions, external loads and contact forces, one can, in principle at least, integrate equations (1) to obtain the state of the system at any time. The contact force $f_{ij}$ can be decomposed into two components: a normal component $f^n_{ij}$ (henceforth referred to as the normal force) perpendicular to the tangent plane at the contact and a frictional component $f^t_{ij}$ in the tangent plane at the contact. The rest of the equations presented below pertain to the detemination of the contact forces $f_{ij}$ and to modeling impacts.

Friction Law

The friction law is a component of the overall contact model. One of the most generally accepted dry friction laws, the Coulomb friction law, states that the magnitude of the frictional force $f^t_{ij}$ can be no greater than $\mu$ times the normal force at the contact, where $\mu$ is the coefficient of friction. At slip, the friction force is equal to $\mu$ times the normal force and it opposes the direction of slip. If $v^t_{ij}$ is the tangential slip velocity at the contact, and $\lambda$ is a positive number that is a function of the slip velocity, the law can be summarized in the form of one equation, two inequalities and a complementarity condition:

$$v^t_{ij} = -\lambda f^t_{ij}, \lambda \geq 0, \mu |f^n_{ij}| - |f^t_{ij}| \geq 0 \lambda (\mu |f^n_{ij}| - |f^t_{ij}|) = 0 \quad (2)$$

This says that neither $\lambda$ nor $\mu |f^n_{ij}| - |f^t_{ij}|$ can be negative and only one an be non-zero.

Frictional forces are dissipative in nature and are the major source of energy dissipation when bodies slide against each other. With the rigid body assumption, Coulomb friction forces are dissipative only when there is sliding between the contacting surface. No frictional dissipation occurs during other forms of motion in contact, for instance during pure rolling or during pivoting. Friction forces can be discontinuous, even in a continuous state of steady sliding. For example, when the motion of a planar slider is reduced to a rotation about a point of contact, the friction force at this point can jump at the instant when it goes from a state of slip to that of no slip. In turn, this leads to discontinuity in the overall contact force.

Contact Models Generally

This contact model allows estimation of both normal and tangential components of contact force. Depending on the model, both these components can also be discontinuous. Contact forces (and the resulting accelerations) can evolve rapidly during impact or during the making and breaking of a contact, therby imbuing the contact model with a time scale that may be much compressed compared to that for free motion of the bodies. In turn, this variation in time scale may lead to discontinuous and stiff differential equations as governing equations for the system.

When distributed contact occurs, i.e. contact cannot be confined to a point, and the model only deals with point contacts (as in our case), additional assumptions have to be made about distributing such contact over a finite number of points. Distributed contact can occur frequently between polyhedral bodies with the exact contact distribution being indeterminate. Assumptions about contact force distrubtion affect the net moment that they produce.

Assuming bodies to be perfectly rigid, multiple point contacts between them can also lead to a situation akin to static indeterminacy, i.e. a unique normal contact force distribution cannot be determined although the resulting net force and moment are know. By itself this may not be a problem since motion can still be determined uniquely. with friction, however cases may arise where the indeterminacy of friction forces due to indeterminacy in the normal force distribution results in net force and moment, and hence motion, being unknown. A simple, albeit artificial, example would be a perfect fitting circle translating along and inside two parallel walls. The indeterminacy associated with the normal contact forces implies that the magnitude of the friction force, and hence the motion is not uniquely determinate. Usually this is resolved by relaxing the rigidness assumption to include localized deformations for computing forces.

The Contact Model used in the Modelling System

Figure 3:
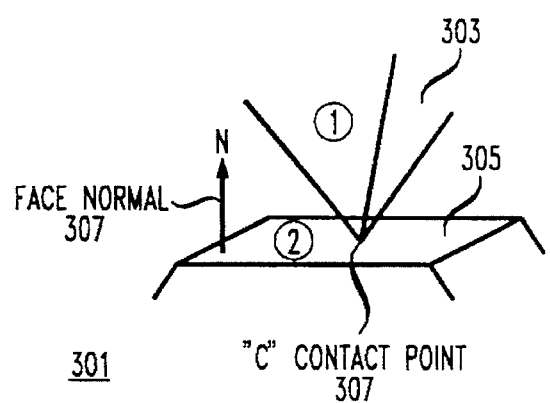
FIG. 3 is a schematic drawing of a vertex-face contact.

In order to fully capture the deformation process at a contact, models can get arbitrarily complex. For example, the interaction between neighboring material as the contact point moves on the body due to rolling or sliding can be quite involved. Since computational speed and stability are of the essence, contact models should have a fairly minimalist flavor. We confine ourselves to contacts that are gentle enough that only nonpermanent, local effects are important. In order to simplify the geometry of contact, we require, as noted above, that the moving objects be convex polyhedra, as shown in FIG. 3. Under this restriction, rolling (in which the point of contact moves with respect to the bodies even though there is no slip) does not occur. In the polyhedral world, the point of contact moves with respect to the bodies if and only if the bodies slide against each other. Thus, in FIG. 3, vertex 303 is in contact with face 305 and may slide on that face.

Many-faceted polyhedra that approximate smoothly curved bodies may exhibit motion that is nearly indistinguishable from rolling even though rolling does not occur in the strict sense. The number of polyhedra in the system, the number of faces each one may have, and the external forces and force fields they may be subjected to are (in principle at least) unconstrained. When two of the polyhedral bodies are in contact, they stick or slip in accordance with Coulomb friction, where $\mu$ can be specified for every pair surfaces.

Convex polyhedra can contact each other in any of six ways: face-face, face-edge, face-vertex, edge-edge, edge-vertex, vertex-vertex. Four of these, all but face-vertex and edge-edge, are degenerate because in these cases there always exists an arbitrarily small linear or angular displacement that converts the contact to one of the two nondegenerate types. At the expense of an arbitrarily small displacement error, then, we can confine our attention to the two nondegenerate types of contact.

Figure 4A:
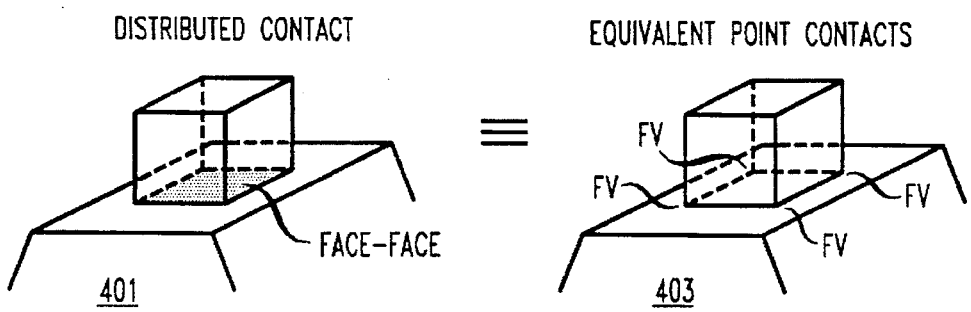
FIG. 4 shows examples of replacement of degenerate contacts with sets of nondegenerate point contacts.
Figure 4B:
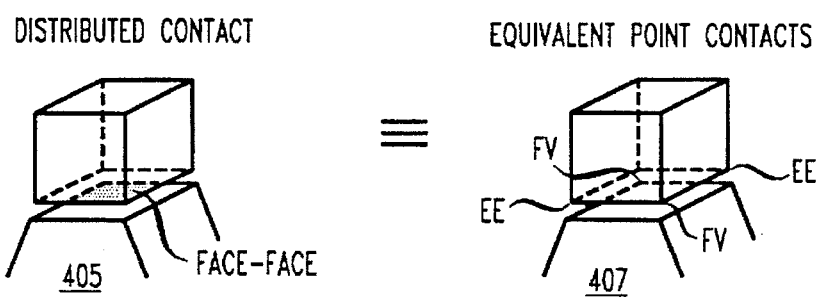
Figure 4C:
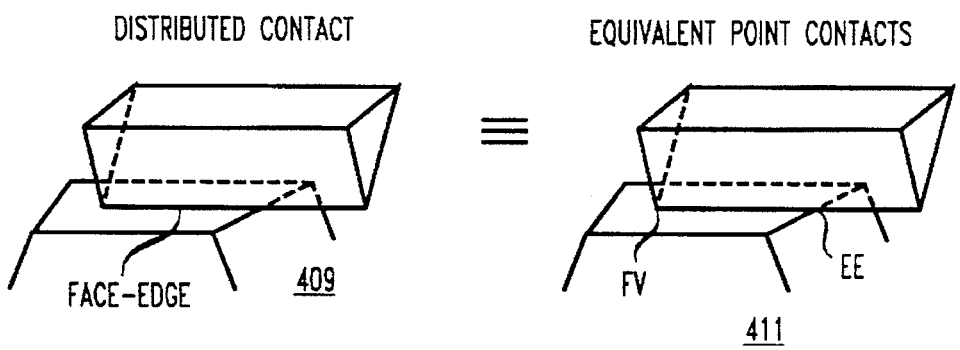

There are many ways to replace degenerate contacts by neighboring nondegenerate ones. We have chosen to do this as shown in FIG. 4: Consider first the face-face cases 401 and 405, in which the area of contact is a convex polygon p. As shown at 403 and 407, by means of a suitably chosen small tilt, the degenerate face-face contact can be converted to a nondegenerate contact (face-vertex or edge-edge) at any of polygon p's vertices. Since there is no reason to choose one vertex over another, we assume that all of the nondegenerate contacts at p's vertices occur simultaneously. Thus we replace a degenerate contact with a multiplicity of nondegenerate contacts.

This replacement has definite consequences. For example, if the bodies are turning against each other about an axis that is orthogonal to the contacting faces, the frictional moment depends on the distribution of pressure over the interior of p. By distributing the pressure over points on the periphery of p, our assumption yields a different value for the frictional moment than some other plausible distributions, such as the uniform distribution, would yeild. In reality, the distribution of contact pressure depends on the microscopic irregularities in the faces of the two polyhedra and is therefore almost always unpredictable.

In the case of face-edge contact 409, p degenerates to a line segment and the vertices to endpoints. A suitable small tilt produces a nondegenerate contact at either of the two endpoints. We replace the degenerate face-edge contact with the simultaneous occurrence of the two nondegenerate endpoint contacts, as shown at 411. In all other cases, a single nondegenerate contact is chosen arbitrarily from the neighborhood of the degenerate contact.

In both of the nondegenerate cases, there is a well defined plane of contact. In a face-vertex contact, this is the plane of the face; in an edge-edge contact it is the unique plane containing the two edges. (If the edges coincide so that the plane is not unique, then the contact is degenerate.)

Figure 5:
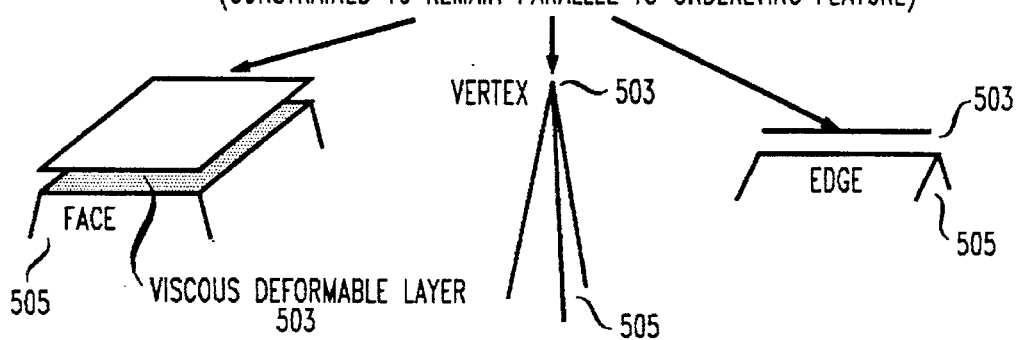
FIG. 5 is a conceptual diagram of the model for contacts used in the modelling system.

When two bodies collide, however gently, there must occur some deformation of the bodies, however small. To simplify the phenomena associated with deformation, we make the supposition shown in FIG. 5: that all deformation takes place in a thin viscous massless layer 503 covering the surface of each polyhedron. Underneath this layer we suppose that there is a perfectly rigid polyhedron 505, which we will denote by P.

Faces, edges and vertices are treated independently. Consider first a face. We suppose that the outer surface of the layer 501 covering the face is a rigid plane constrained to remain parallel to the underlying face of P. A lossy (viscous) elastic connection 503 between the rigid plane and P permits microscopic displacement of the plane 501 in any direction relative to P, provided parallelism is maintained. Analogously, an edge is modeled as a rigid line constrained to remain parallel to the underlying edge of P but otherwise free to move microscopically under lossy elastic contraints of layer 503, and a vertex is modeled as a point with a lossy elastic connection to an underlying vertex of P. The movable planes, lines and points of the model will be called, generically, surface elements 501.

Each surface element 501 has three degrees of freedom relative to P. As explained more formally below, the elastic and damping constants of layer 503 can vary with the direction of surface element 501's displacement. For example, layer 503 for a surface element 501 covering a face might be yeilding in the normal direction, but stiff in tangential directions, or it might be heavily damped in one direction but not in another.

This model can represent well ordinary nondestructive collisions between objects as well as sliding and sticking contacts of longer duration that conform to Coulomb's law. As an illustration of the wide variety of contact behaviors that the model can simulate, consider a mass point striking obliquely the face of a much heavier polyhedron. If the coefficient of friction is zero, and if the connection between the face and P provided by layer 503 is undamped, then the mass point will follow the path of a specularly reflecting light ray with the angle of reflection equal to the angle of incidence. If, however, the connection to P is damped and inelastic like putty, the frictionless mass point will lose the energy in its normal component and, on leaving the point of impact, will skim along the surface on a tangential path. If the coefficient of friction, instead of being zero, is very large, and if the connection to P is isotropically elastic and undamped, then the mass point will leave along its approach path. With a suitable choice of parameter values, it is possible, in fact, to obtain any departure angle from $-\pi/2$ to $\pi/2$ as measured from the face normal. If the impacting object is not a mass point, but a body of finite extent, then the inertial tensor of the body and its initial angular momentum come into play and lead to an even richer set of possible contact behaviors.

Some contact phenomena, however, are not representable by our model. There are those, for example, that violate our assumption of rigidity: consider a thin elastic rod falling obliquely onto a hard floor. If the way the rod bounces is governed mainly by the way it bends as a whole, then our model of a rigid body covered by a compliant surface layer is not appropriate for simulating its motion.

A second situation not representably by our model is illustrated by a slippery but heavy object being pulled across a soft mattress. Even if Coulomb friction between the object and mattress is zero, the object offers some resistance to being pulled if the mattress is lossy, i.e. if its springs are damped. The resistance here is different from Coulomb friction because it varies with the object's velocity and shape. Our model does not capture this kind of non-Coulomb resistance.

The resistance in the latter example depends among other things on the rule by which the mattress springs influence their neighbors. If the influence is zero (as, ideally, in the Beautyrest mattress, which has independent spring coils for support), then only those springs directly under the object are depressed. If the mattress contains a semistiff layer in its top surface, then the springs do influence their neighbors and the depression made by the object spreads beyond the area of contact. In the limit, when the semistiff layer is completely rigid (and constrained to remain parallel to the bottom of the mattress), the example reduces to our model. Our model, then, can be seen as a limiting case of a more general surface layer model.

If two objects (or two surface elements of one object) simultaneously contact the same face or edge of a third object, we treat the two contacts independently, even though a strict application of the model would imply an interaction between the first two objects through the common surface element that both are acting on.

Mathematical Formulation of the Contact Model

Figure 6:
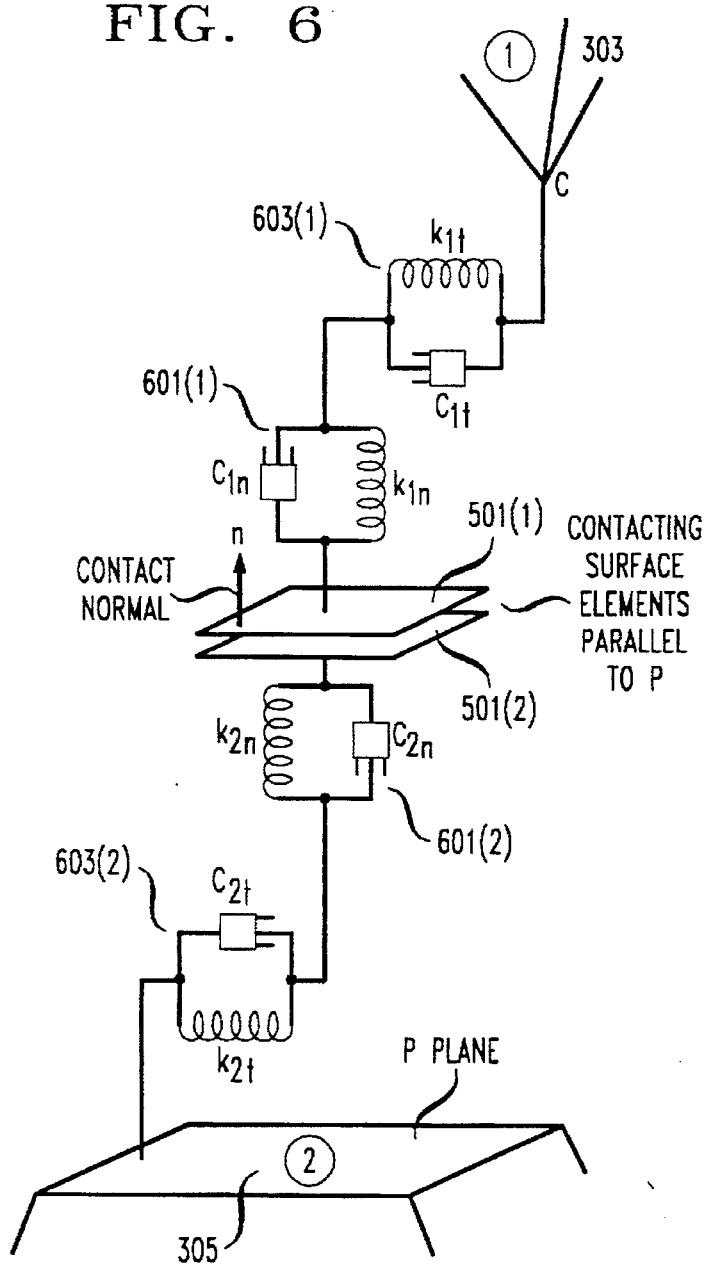
FIG. 6 shows how springs and dampers can be used to model the viscous deformable layer.

In a preferred embodiment, each support connecting a surface element to P is characterized by two tensors, an elastic tensor K and a damping tensor C. FIG. 6 illustrates this characterization in the case of vertex-face contact between vertex 303 and face 305. Vertex 303 and face 305 are connected at point of contact c by a "massless mechanism" composed of springs, dampers, and surface elements 501. The two surface elements 501 are parallel to the plane of contact between the objects. Each surface element 501 is connected to two spring-damper pairs. Pair 601 constrains motion perpendicular to the plane of contact and pair 603 constrains motion parallel to the plane of contact.

When a coordinate system has been specified, each tensor can be represented by a positive definite matrix, which, in the case of K, gives the linear relation between force and displacement and, in the case of C, gives the linear relation between force and velocity. The two contacting objects will be indexed by i=1,2. Let $p_i$=the unstrained position of the contacting surface element of object i.

$q_i$=the actual position of the contacting surface element of object i.

$f_i$=the contact force acting on object i.

$K_i, C_i$=matrices representing the tensors assoicated with the contacting surface element of object i.

The relation between the contact force and the displacement of the surface element is given by the deformation equation:

$$f_i = K_i(q_i - p_i) + C_i(\dot{q}_i - \dot{p}_i) \qquad (3)$$

Force balance at the contact is expressed by $$f \equiv f_1 = -f_2 \qquad (4)$$

Using this equality, we will write all equations in terms of the unsubscripted f, i.e. the contact force acting on object 1.

The Coulomb friction law requires the contact force vector to lie inside or on a cone whose axis is orthogonal to the plane of contact. The algebraic expression of this requirement is that a certain quadratic form in f be nonpositive:

$$f^T Q f \leq 0 \qquad (5)$$

If the coordinate system is chosen so that the z-axis is orthogonal to the plane of contact, then Q is a diagonal matrix with $1, 1, -\mu^2$ down the diagonal and zeros elsewhere, so that the quadratic form, written out, is $$f_x^2 + f_y^2 - \mu^2 f_z^2 \leq 0 \qquad (6)$$

If the objects are slipping against each other, then f lies on the surface of the cone, i.e. the relation (3) is an equality. Further, the projection of f onto the plane of contact points in the direction of object 2's movement relative to object 1. This is expressed by the relations:

$$\dot{q}_2 - \dot{q}_1 = \lambda P f, \ \lambda < 0 \qquad (7)$$

where P is the singular linear transformation that projects f onto the plane of contact. In a coordinate system with z orthogonal to the plane of contact, P has 1,1,0 down the diagonal and zeros elsewhere. Note that setting $\lambda=0$ in equation (7) gives $\dot{q}_2 = \dot{q}_1$, the condition for sticking.

All quantities defined so far are known at time t. The aim of the simulation is to find their values at time t+Δt. The dynamics model, which determines the changes in positions and velocities of the objects in response to the forces, does part of the job: using the forces at time t, it updates the positions and velocities of the rigid, underlying polyhedra to time t+Δt. Since the unstrained positions and velocities of the surface elements (i.e. $p_i$ and $\dot{p}_i$) are fixed with respect to the rigid polyhedra, the dynamics model also determines these for time t+Δt. It remains to find $q_i$, $\dot{q}_i$ and f at t+Δt. These are determined by the contact model. The new value of f will be used in the next update of the dynamics model; the new values of $q_i$ and $\dot{q}_i$ will be used in the next update of the contact model.

In addition to the equations and inequalities stated above, the contact model needs one further equation, the continuity equation:

$$q_i(t+\Delta t) = q_i(t) + \Delta t \dot{q}_i(t+\Delta t) \qquad (8)$$

With equal validity, $\dot{q}_i$ can be taken at any point in the interval (t,t+Δt). As written, equation (8) gives the results in a particularly convenient form.

The following algebra obtains the unknown f(t+Δt) in terms of known quantities. Substituting (8) into (3) when the latter is taken at time t+Δt gives, $$f_i(t+\Delta t) = K_i(q_i(t) - p_i(t+\Delta t)) - C_i \dot{p}_i(t+\Delta t) + (C_i + \Delta t K_i)\dot{q}_i(t+\Delta t) \qquad (9)$$

Giving new names $b_i$ and $B_i$ to combinations of known quantities, we can write equation (9) as $$f_i(t+\Delta t) = b_i + B_i \dot{q}_i(t+\Delta t) \qquad (10)$$

where $$b_i = K_i(q_i(t) - p_i(t+\Delta t)) - C_i \dot{p}_i(t+\Delta t), \ B_i = C_i + \Delta t K_i$$

Note that $B_i$ is positive definite because $C_i$ and $K_i$ are. Writing equations (10) separately for i=1,2 and using (4), we get $$f(t+\Delta t) = b_1 + B_1 \dot{q}_1(t+\Delta t), \ -f(t+\Delta t) = b_2 + B_2 \dot{q}_2(t+\Delta t) \qquad (11)$$

Taking the appropriate linear combination of these and using (7) to eliminate $\dot{q}_2(t+\Delta t) - \dot{q}_1(t+\Delta t)$, we obtain $$(A + \lambda P)f(t+\Delta t) = a \qquad (12)$$

where $$A = B_1^{-1} + B_2^{-1}, \ a = B_1^{-1} b_1 - B_2^{-1} b_2$$

Note that A is positive definite because the $B_i$ are. In equation (12) the only unknown quantity other than f(t+Δt) is λ.

If $\lambda=0$, then by (7) the objects are sticking at the contact point. To see whether $\lambda=0$ yields a valid solution, solve equation (12) for $\lambda=0$ and denote the solution by f*:

$$f^* = A^{-1} a \qquad (13)$$

Now check to see if this solution satisfies the Coulomb condition, $f^{*T} Q f^* \leq 0$. If it does, then set $$f(t+\Delta t) = f^*$$

Find $q_i(t+\Delta t)$ and $\dot{q}_i(t+\Delta t)$ by using equations (11) and (8).

If f* does not satisfy the Coulomb condition, i.e. if $f^{*T} Q f^* > 0$, then $\lambda > 0$ and by (7) the objects are slipping. To find λ and f(t+Δt) in this case, proceed as follows: Let f(λ) be the solution of (12), i.e.

$$f(\lambda) = (A + \lambda P)^{-1} a \qquad (14)$$

And let $$Q(\lambda) = f^T(\lambda) Q f(\lambda) \quad (15)$$

The Coulomb condition for slipping is $$Q(\lambda) = 0 \quad (16)$$

The desired value of $\lambda$, then, is the positive root $\lambda^*$ of this equation. Once this root is found, equation (14) gives $f(t+\Delta t)$:

$$f(t+\Delta t) = (A + \lambda^* P)^{-1} a$$

As before, $q_i$ and $\dot{q}_i$ at $t+\Delta t$ are given by (11) and (8).

Solving for $\lambda^*$ is easier when the tensors have certain symmetries and when the coordinate system is judiciously chosen. In a presently-preferred embodiment, the tensors satisfy the following constraints:

(a) The principal axes of the K and the C associated with any surface element have the same orientation.

(b) One principal axis of any tensor associated with a face is orthogonal to the face.

(c) One principal axis of any tensor associated with an edge coincides with the edge. In the plane orthogonal to the edge, the tensor is isotropic. Thus any pair of orthogonal axes in that plane can serve as principal axes.

(d) Any tensor associated with a vertex is fully isotropic so that any system of orthogonal axes can serve as principal axes.

In other embodiments, tensors which do not satisfy these constraints may be employed.

The most convenient coordinate system for describing the evolution of a contact is aligned with the plane of contact: We take x and y to lie in this plane and z to be orthogonal to it. In any (orthogonal Cartesian) coordinate system, the matrices representing K and C are symmetric and positive definite; if the coordinate axes happen to coincide with the principal axes of the tensors, then the matrices are diagonal. In the case of a vertex-face contact, the coordinate system and the tensor axes can always be chosen so that they are aligned: It is sufficient simply to choose the coordinate directions so they are aligned with the axes of the face tensors. Since the vertex tensors are isotropic, the same coordinate directions can serve as principal axes for these as well. In the vertex-face case, then, all the tensors can be represented by diagonal matrices. Note that if the matrices $K_i$ and $C_i$ are diagonal, then $B_i$ and A are also. This follows directly from their definitions, equations (10) and (12).

In the case of edge-edge contacts, the z coordinate axis is taken to be orthogonal to both edges. Because of condition (c) above, one principal axis of each edge tensor can be chosen to be aligned with z. One of the other coordinate axes, say the x-axis, can be aligned with one of the two edges, say the edge of object 1. The axes of the tensors associated with the object 1 edge, then, can be chosen to lie in the coordinate directions, so that these tensors can be respresented by diagonal matrices. With this choice of coordinates, the tensors associated with the object 2 edge will, in general, be aligned only with the z-axis but not with x and y. The matrices representing the object 2 tensors, then, will in general not be entirely diagonal but will decompose into a 2×2 block and a 1×1 block as illustrated below:

$$\begin{bmatrix} K_{xx} & K_{xy} & 0 \\ K_{xy} & K_{yy} & 0 \\ 0 & 0 & K_{zz} \end{bmatrix}$$

It can be shown algebraically that if $K_i$ and $C_i$ have the block form illustrated above, then A also has this form. In the next paragraphs we show that if A has the block form and if $Q(0) > 0$, then $Q(\lambda) = 0$ has a unique positive root $\lambda^*$. The proof will also provide more explicit formulas from which $\lambda^*$ can be calculated. Once $\lambda^*$ is known, $f(t+\Delta t)$, $q_i(t+\Delta t)$, $\dot{q}_i(t+\Delta t)$ can be found, as noted above, by direct substitution.

To summarize the problem: we are given equation (12), $(A+\lambda P)f=a$, where the positive definite matrix A has the block form illustrated above, P has 1, 1, 0 down the diagonal and zeros elsewhere, and a is a given vector. The solution vector f depends on $\lambda$. We seek a value of $\lambda$ such that $f(\lambda)$ satisfies the Coulomb condition for slipping, $Q(\lambda) = f^T(\lambda) Qf(\lambda) = 0$. It has already been established that $Q(0) > 0$, i.e. $\lambda = 0$ is not a solution, hence (by equation (7)) there is slipping at the contact.

Let A* denote the 2×2 block in A, and let $A_{zz}$ denote the single element in the 1×1 block. The z-component of f is independent of $\lambda$ and can be calculated once and for all:

$$f_z = \frac{a_z}{A_{zz}}$$

Since the z-axis is orthogonal to the contact plane, Q is a diagonal matrix; hence $Q(\lambda)$ can be written (equation (6)) as, $Q(\lambda) = f_x^2(\lambda) + f_y^2(\lambda) - \mu^2 f_z^2$. To show that $Q(\lambda) = 0$ has a unique positive solution, it is sufficient to show that $$Q^*(\lambda) = f_x^2(\lambda) + f_y^2(\lambda)$$

decreases monotonically to zero as $\lambda$ increases from zero to infinity.

Because A is positive definite, so is A*. Let $x_1$, $x_2$ be the eigenvectors and $l_1$, $l_2$ the eigenvalues of A*, i.e., $A^* x_i = l_i x_i$. Since A* is positive definite, its eigenvalues are positive. Now consider the reduced 2D problem, $$(A^* + \lambda I) f^* = a^* \quad (17)$$

where f* and a* consist of the first two components of f and a. Expand f* and a* in eigenvectors:

$$f^* = c_1 x_1 + c_2 x_2, \quad a^* = \alpha_1 x_1 + \alpha_2 x_2$$

The $\alpha$'s can be regarded as known (since they are derived from A* and a*); the c's are to be determined. Substituting into equation (17) and equating coefficients, we obtain $$c_1 = \frac{\alpha_1}{l_1 + \lambda}, \quad c_2 = \frac{\alpha_2}{l_2 + \lambda}$$

Because of the orthonormality of the eigenvectors, $$Q^*(\lambda) = f^* \cdot f^* = c_1^2 + c_2^2 = \frac{\alpha_1^2}{(l_1 + \lambda)^2} + \frac{\alpha_2^2}{(l_2 + \lambda)^2}$$

which (because the eigenvalues are positive) decreases monotonically to zero as $\lambda$ goes to infinity. This completes the proof.

The equation $Q(\lambda)=0$ becomes $$\frac{\alpha_1^2}{(l_1+\lambda)^2} + \frac{\alpha_2^2}{(l_2+\lambda)^2} - \mu^2 \frac{a_z^2}{A_{zz}^2} = 0$$

which is easily solved numerically for $\lambda^*$. If A happens to be a diagonal matrix, then $l_1$ and $l_2$ are just the first two diagonal elements of A, and $\alpha_1$ and $\alpha_2$ are just the first two components of a.

The dynamics model is referred to a fixed, inertial coordinate system. Relative to this system, the contact plane, and with it the contact model's coordinate system, can rotate and move about. The contact model's coordinate system, then, is not an inertial system. Fortunately, this does not matter mechanically because there is no mass in the contact model. It is, however, necessary to translate the new positions and velocities provided by the dynamics model from the inertial system into the system used by the contact model. The latter system may well be different now from what it was $\Delta t$ time units ago.

We have said that the contact model coordinates should be aligned with the contact plane, but we have not said where the origin should be. The choice of origin is not crucial, provided it is well defined. A convenient choice is to fix the origin with respect to one of the objects, i.e. with respect to that object's underlying rigid polyhedron P. It can be taken, for example, as a fixed point on the unstrained position of the contacted surface element of object 1. In that case, $p_1$ and $\dot{p}_1$ are, by definition, zero at all times.

It may seem curious that equation (10), $B_i=C_i+\Delta t K_i$, contains the increment $\Delta t$. The $\Delta t$ comes from the approximate continuity equation (8), which is necessary to ensure that the two functions of time $q_i(t)$ and $\dot{q}_i(t)$ are consistent. Once the model is set up, $\Delta t$ can be allowed to go to zero and the model becomes a purely differential system. This passage to zero, however, has interesting consequences for the limiting cases where the $C_i$'s or the $K_i$'s associated with a contact are zero, and the formulation for calculating f(t), $\dot{q}_i(t)$ and $\lambda$ has to be somewhat altered. These alterations are described in detail in the following discussion of the preferred embodiment.

Our simulation program 117 consists of two independent modules that interact through well defined interfaces. They are:

1. dynamics module 119 that formulates the governing equations for the system, estimates the contact forces and other loads (forces and moments) based on information provided by the geometry module, and integrates the equations of motion to systematically update the state of the system.

2. geometry module 121 that models the shape, mass and inertial attributes of each body. The 'world' of objects is restricted to a subclass of convex polyhedra, which leads to simpler (and faster) geometry algorithms. The main geometric problem, called contact analysis, involves detecting the onset of a contact, evaluating details of the contact, tracking it through the entire contact episode, and determining (with the aid of the dynamics module) the end of contact. Detecting initial contact is an exercise in collision detection, a subject that has been discussed extensively in the literature. We have our own method for solving this problem, but it is similar to previously described techniques. However, contact analysis, including the logic used to convert geometric interference information into a list of active contacts for the force model, involves substantially new issues. The geometry module also provides a display system that renders the results of the simulation in the form of an interactive animation on a computer display terminal.

The following discussion presents an explanation of the overall program structure, a description of the dynamics module, including sub-sections on the discrete contact model that we implement and its associated state equations, details about tuning model parameters and estimating and controlling model response for numerical stability, and the details of geometric processing, including object representation, the equation integration/geometric analysis paradigm, contact analysis and special cases that must be considered. Thereupon the simulation system environment is described and performance issues are discussed.

SIMPLIFIED OVERALL PROGRAM STRUCTURE

Figure 7:
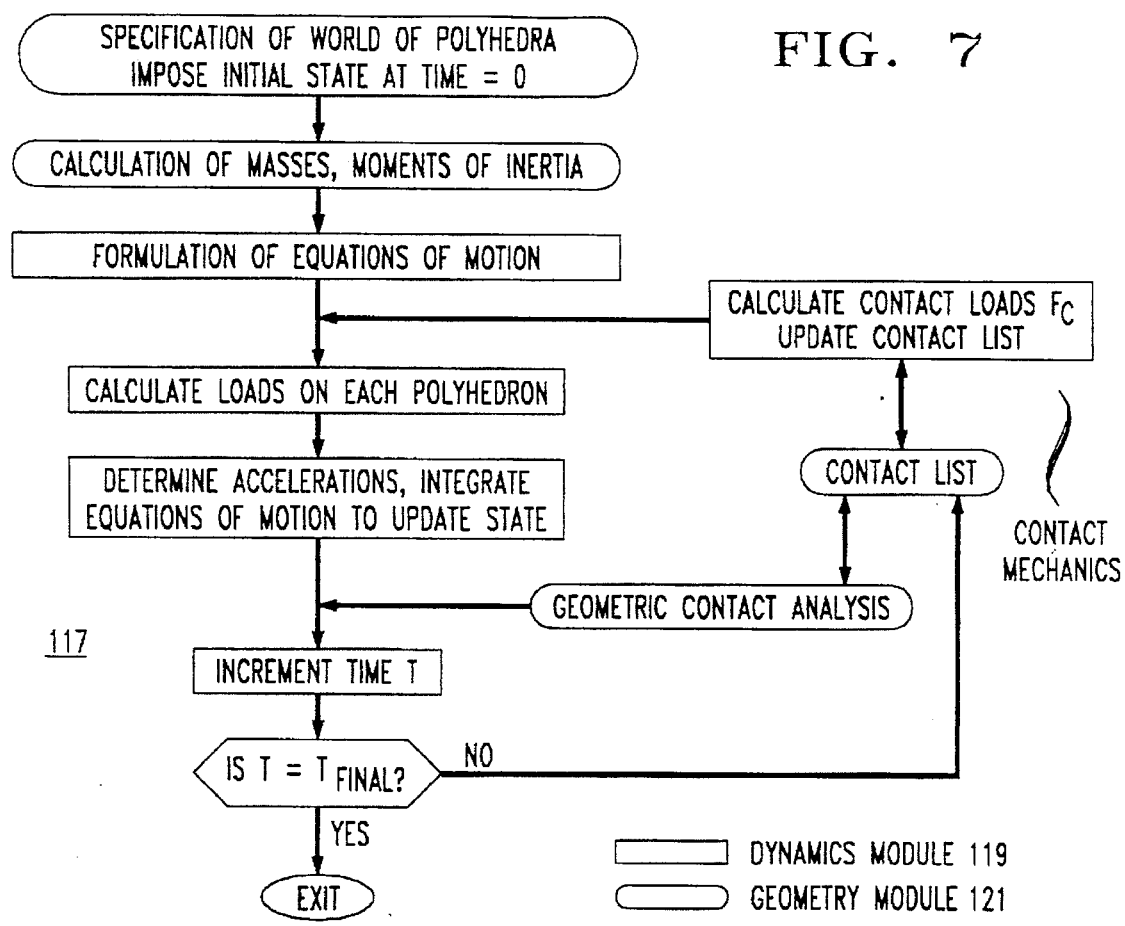
FIG. 7 is a flowchart for modelling program 117.

To put the different functions in our software system in proper perspective, a simplified flowchart is shown in FIG. 7. In that figure, steps performed by geometry module 121 are indicated by boxes with rounded ends, while steps performed by dynamics module 119 are indicated by boxes with square ends. At program initiation, the geometry module reads a user specified input file 131 to create a world of convex polyhedra described in current state 123. The file contains object shape specifications, initial positions and velocities, and material and frictional properties. Masses and inertias are computed from this information. The dynamics of the system are simulated by integration of the Newton-Euler equations of motion, where each rigid polyhedron is considered to be moving freely under the effect of gravity (and perhaps other body forces) and contact loads.

The equations of motion are straightforward and not subject to any explicit constraints, since the constraints are enforced automatically by the contact loads. This is an advantage of the soft contact approach because formulation of the intermittent contact constraints for bodies that move while maintaining point contact can be quite complex. However, the contact forces, and thereby the accelerations, can evolve rapidly during contact, leading to stiff differential equations of motion. The loads on every polyhedron being known, their accelerations can be calculated from the equations of motion.

Integration of the accelerations and velocities over a small time interval yields the proposed new state (velocities and positions) of the system at the end of the interval. For stable integration of the stiff differential equations, we use an adaptive time step fourth order Runge-Kutta scheme. The state of every rigid body is maintained in current state 123 as a list of 13 numbers—3 for linear velocity, 3 for angular velocity, 3 for position and 4 for orientation in terms of a quaternion. Our integration scheme is a substantially modified version of the algorithm presented in M. K. Brown, "A Controlled Impedence Robot Gripper", *AT&T Technical Journal*, Vol. 64, No. 4, pp. 937–969, 1985. The proposed new state is passed to geometry module 121 which determines the corresponding geometric relationship (contacts, etc.) between the objects. If there is no change in the topology of contact, i.e., the complete list of VF or EE contacts between all pairs of objects, then the proposed state is accepted as a new state and time is incremented. In the case when new contacts are detected the system interpolates to approximate the time of precise onset of the earliest new contact, and the equations of motion are reintegrated up to this time. Broken contacts are dropped from the 'contact list.'

The flow of control during geometric contact analysis is more involved than that shown in the simplified flow chart of FIG. 7. Details of these operations are described below.

As part of the geometric contact analysis, the module produces and updates a contact list containing detailed geometric information about all active contacts among the bodies. The dynamics module scans the contact list and calculates contact forces at every contact. The estimation of contact forces from geometric information and material parameters is based on an implementation of the contact model previously described. The contact loads, in turn, feed into the equations of motion and the integration loop proceeds. In the following section we explain our implemented contact model and the associated material parameters.

DYNAMICS MODULE 119

THE CONTACT MODEL

In the foregoing theoretical discussion, we presented a conceptual model for formulating material behavior during contact between polyhedral objects. There is no restriction on the size or number of faces in these polyhedra. In principle, objects with smooth surfaces can be approximated by polyhedra with arbitrarily large numbers of faces, so our contact model can apply to all solid objects without restriction. In practice, the number of faces must be constrained to limit the computational effort in the geometry module. As was shown in the theoretical discussion, all types of contact between a pair of polyhedral objects can be analyzed as a combination of discrete vertex-face (VF) and/or Edge-Edge (EE) contacts. Hence the polyhedral features of primary interest in our discrete model, described below, are vertices, edges and faces.

Vertex-Face Contacts

The microscopic vicinity of each VF contact is modeled through a 'massless mechanism' composed of springs and dampers as shown in FIG. 6. The polyhedron 303 with the vertex has been labeled 1 and the polyhedron 305 with the face as 2. The outside normal to the face is the contact normal n and the plane of the face defines the tangent plane $P_t$ at contact. Actual contact between the vertex and the face occurs through surface elements (SEs) 501. The SE's are constrained to remain parallel to $P_t$ throughout the contact episode. The contacting surface elements do not penetrate each other and neither do they separate, but they can slip against each other. So all relative motion between the SE's occurs in the plane $P_t$. Both n and $P_t$ can be evolving (changing location and/or orientation) in inertial space during a contact episode as the pair of contacting polyhedra move in space.

The SE associated with the vertex is connected to it through two pairs (601, 603) of massless springs and dampers. One of the spring damper pairs, called the normal spring ($k_{1n}$) and damper ($c_{1n}$), (601(1)) is constrained to be along n. The only deformation permitted for the normal spring is compressive. This is because objects do not pull at each other at contact, but push. The other pair, the tangential spring and damper ($k_{1t}$ and $c_{1t}$), (603(1)) always stays in a plane parallel to $P_t$. Their orientation in this plane is parallel to the direction of slip between the contacting SE's. A similar arrangement of springs and dampers (601(2), 603(2)) connects the SE associated with the face. Spring and damper constants for each element can be turned to model material behavior of the underlying polyhedra, as shown in succeeding sections. Given this mechanism, a typical VF contacts evolves as follows.

At the onset of contact there is no slip (relative tangential velocity) between the SE's, and springs are at their equilibrium lengths. The relative velocity of the vertex with respect to its associated SE causes the intervening springs to deform; similarly, relative velocity of the face with respect to its SE deforms the other set of springs. The component of relative velocity along n causes the normal springs, $k_{1n}$ and $k_{2n}$, to deform and the tangential component deforms $k_{1t}$ and $k_{2t}$. Deformed springs and velocities at the dampers produce forces that balance the contact force $F_c$ between the SE's. Since the entire mechanism of springs, dampers, and surface elements that exists at a contact is massless, there are no net forces or moments acting on it. Net loads on a massless body would yield 2 i accelerations. From Coulomb's low of friction, for a given normal force and coefficient of friction the maximum friction force that can be generated between the contacting SE's is the product of the two.

When the force produced by the tangential elements equals the maximum friction force that can be sustained between the SE's, slip occurs. The force produced by the springs and dampers, which equals the contact force between the SE's, is in the applied to the interacting polyhedra. The point of application 'C' of the contact force is always taken to be the position of the vertex in a vf contact.

The VF contact ceases to exist if either the deformation of both the normal springs becomes tensile or the geometry computations indicate that the vertex has slip off the face.

Edge-Edge Contacts

Figure 8:
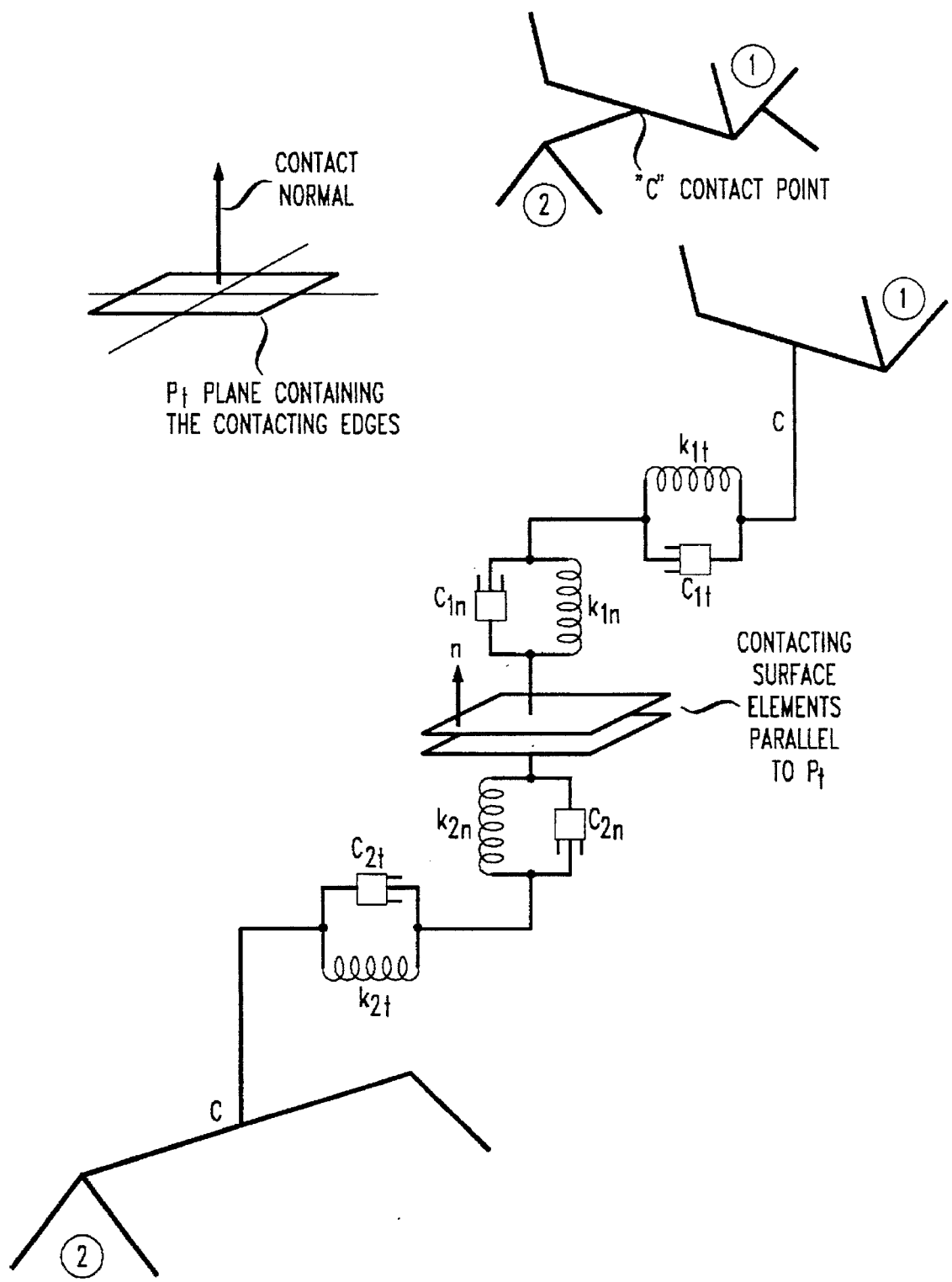
FIG. 8 is a schematic drawing of an edge-edge contact.

The microscipic region surrounding and EE contact is modeled indentically to that of a VF contact, as shown in FIG. 8. $P_t$ is the plane containing the two edges and n is the normal to this plane. the point of application of the contact force is the actual point of contact between the two edges, which is determined by geometric computations and changes as the edges slip against each other.

Each individual VF or EE contact is tracked through four state variables that are appended to the state variable array for the entire system in current state 123. They are $s_{1n}$, $s_{2n}$ to track the lengths of the normal springs $k_{1n}$, $k_{2n}$, and $s_{1t}$, $s_{2t}$ to track the lengths of the tangential springs $k_{1t}$ and $k_{2t}$. They are initialized to zero at beginning of contact. The fact that only compressive deformation of normal springs is allowed implies that $s_{1n} \cdot n \leq 0$ and $s_{2n} \cdot n \geq 0$.

Contact Force and Equations of State

We will now derive expressions for calculating the contact force and the rate of change of the springs in the 'contact mechanism'. The expressions apply with equal validity to both VF and EE contacts. The derivation follows the same steps as in the theorectical discussion. However, there are some simplifications that arise due to differences between the implemented model and the general model proposed in the theoretical discussion. The presentation below concentrates mostly on these differences.

Figure 16:
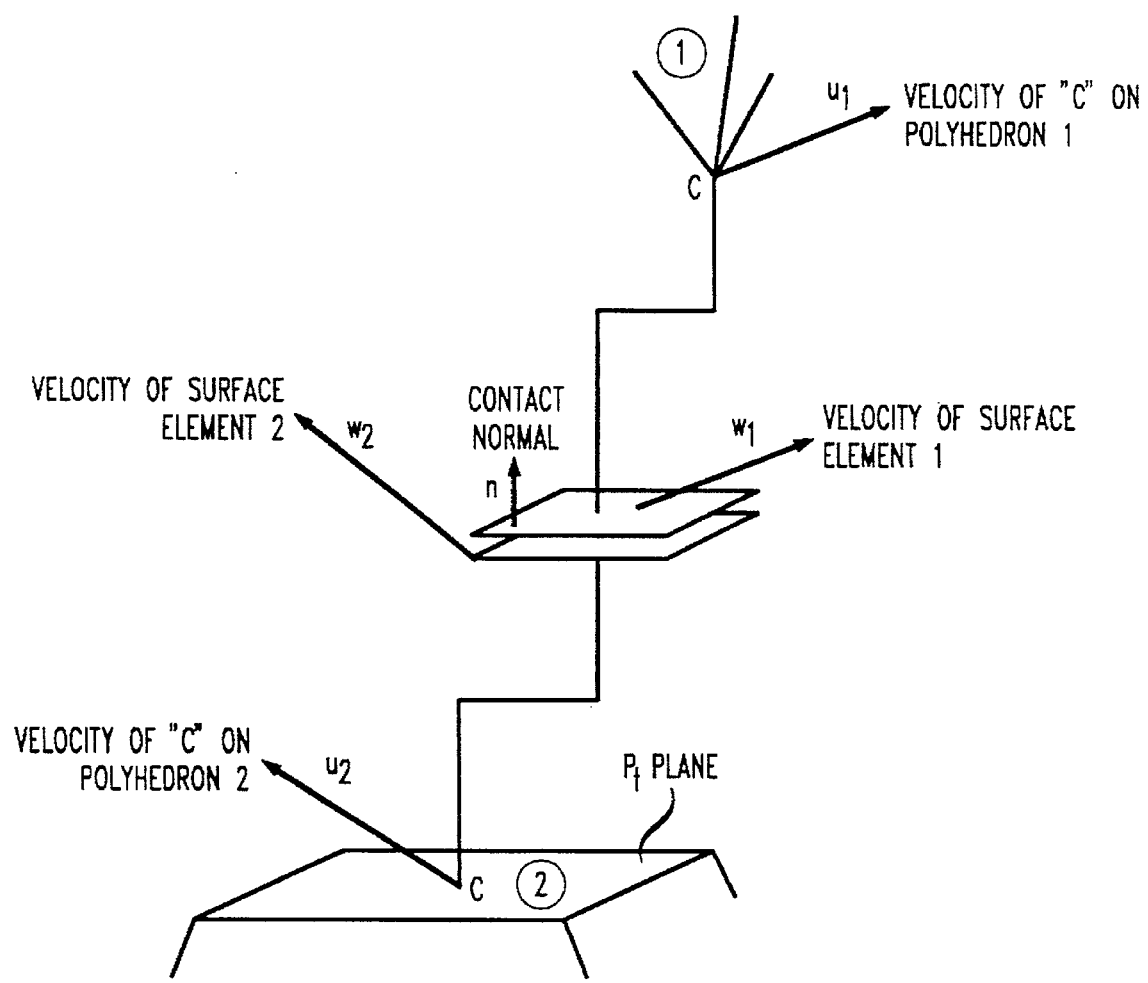
FIG. 16 is a schematic drawing of a vertex-face contact showing the various elemental velocities at a contact point.

As shown in FIG. 16, the contact force $F_c$ has two components: the normal component $F_n$ along n and the frictional component $F_t$ in the tangent plane of contact. For reference, we shall follow the schematic of the VF contact of FIG. 6. Here $F_c$ represents the force that is applied by polyhedron 2 (containing the face) to polyhedron 1 (containing the vertex). It should be noted that, in turn, polyhedron 1 applies a contact force of $-F_c$ to polyhedron 2. The absolute velocity of the contact point 'C' on polyhedron 1 is denoted by $u_1$ and on polyhedron 2 by $u_2$. The absolute velocities of the two SE's are denoted by $w_1$ and $w_2$. FIG. 16 shows these velocities. Subscripts n and t specify components along n and in the plane $P_t$, respectively. Bold letters specify vector quantities, $$(\dot{\ }) = \frac{d(\ )}{dt},$$

and i=1,2. $F_n$ and $F_{st}$ are given by $$F_n = -k_{1n}s_{1n} - c_{1n}\dot{s}_{1n} = -k_{2n}s_{2n} + c_{2n}\dot{s}_{2n} \qquad (18)$$

$$F_t = -k_{1t}s_{1t} - c_{1t}\dot{s}_{1t} = k_{2t}s_{2t} + c_{2t}\dot{s}_{2t} \quad (19)$$

and $$\dot{s}_{in} = u_{in} - w_{in}, \quad \dot{s}_{it} = u_{it} - w_{it} \quad (20)$$

With $\Delta u = u_1 - u_2$, $\Delta w = w_1 - w_2$, and $\Delta w_n = 0$ (no relative motion between the SE's along n), substitution into equation (20) yields $$\dot{s}_{1n} - \dot{s}_{2n} = \Delta u_n, \quad \dot{s}_{1t} - \dot{s}_{2t} = \Delta u_t - \Delta w_t \quad (21)$$

To proceed further, we have to branch into the various cases delineated below.

All Dampers Non-Zero

This is the case when $c_{1n}, c_{2n}, c_{1t}, c_{2t} > 0$. Through manipulation of equations (18), (20) and (21) we obtain $$F_n = -b_n, \quad F_t = -b_t + c^* \Delta w_t \quad (22)$$

where $$c^* = \frac{c_{1t} c_{2t}}{c_{1t} + c_{2t}}, \quad (23)$$

$$b_n = \frac{1}{c_{1n} + c_{2n}} (c_{2n} k_{1n} s_{1n} - c_{1n} k_{2n} s_{2n} + c_{1n} c_{2n} \Delta u_n)$$

$$b_t = \frac{1}{c_{1t} + c_{2t}} (c_{2t} k_{1t} s_{1t} - c_{1t} k_{2t} s_{2t} + c_{1t} c_{2t} \Delta u_t)$$

If $\mu$ is the coefficient of friction between the two surfaces and $\lambda$ is a non-negative real variable, then the friction law can be expressed as:

$$F_t \leq \mu F_n, \quad \Delta w_t = -\lambda F_t, \quad \lambda \geq 0 \quad (24)$$

In equations (22), (23) and (24), $c^*$ is a constant, and $b_n$ and $b_t$ can be calculated from known information at every time step. This implies that $F_n$ is known. The only remaining unknowns are $F_t$, $\Delta w_t$ and $\lambda$. Substitution of equations (22) and (23) into equation (24) gives, $$\frac{b_t}{(1 + \lambda c^*)} \leq \mu b_n \quad (25)$$

As in the theoretical discussion at every time step we first check if $b_t \leq \lambda b_n$. If so, then the SE's are in a state of stick and we set $\lambda = 0$ and $\Delta w_t = 0$. This implies that $F_t = -b_t$ can be calculated.

If $b_t > \mu b_n$, then we determine the value of $\lambda$ that makes $$\frac{b_t}{(1 + \lambda c^*)} \leq \mu b_n,$$

which is $$\lambda = \frac{b_t - \mu b_n}{c^* \mu b_n} \quad (26)$$

Once $\lambda$ is known, the other unknowns can be calculated from $$F_t = -\frac{b_t}{(1 + \lambda c^*)}, \quad \Delta w_t = \frac{\lambda b_t}{(1 + \lambda c^*)} \quad (27)$$

The state of the springs in the contact mechanism is tracked with the following differential equations, obtained from equations (18), (19) and (21):

$$\dot{s}_{1n} = \frac{c_{2n}}{c_{1n} + c_{2n}} \Delta u_n - \frac{1}{c_{1n} + c_{2n}} (k_{1n} s_{1n} + k_{2n} s_{2n}),$$

$$\dot{s}_{1t} = \frac{c_{2t}}{c_{1t} + c_{2t}} (\Delta u_t - \Delta w_t) - \frac{1}{c_{1t} + c_{2t}} (k_{1t} s_{1t} + k_{2t} s_{2t})$$

$$\dot{s}_{2n} = \frac{-c_{1n}}{c_{1n} + c_{2n}} \Delta u_n - \frac{1}{c_{1n} + c_{2n}} (k_{1n} s_{1n} + k_{2n} s_{2n}),$$

$$\dot{s}_{2t} = \frac{-c_{1t}}{c_{1t} + c_{2t}} (\Delta u_t - \Delta w_t) - \frac{1}{c_{1t} + c_{2t}} (k_{1t} s_{1t} + k_{2t} s_{2t})$$

Zero Damping

In the extreme case of completely elastic contacting materials (no damping), $\Delta w_t$ cannot be determined uniquely without adding extra equations and is hence set to zero. The contact model becomes:

$$F_n = -k_{1n} s_{1n} = k_{2n} s_{2n}, \quad \dot{s}_{1n} = \frac{k_{2n}}{k_{1n} + k_{2n}} \Delta u_n,$$

$$\dot{s}_{2n} = \frac{-k_{1n}}{k_{1n} + k_{2n}} \Delta u_n$$

$$F_t = -k_{1t} s_{1t} = k_{2t} s_{2t} \quad \text{subject to} \quad F_t \leq \mu F_n$$

$$\dot{s}_{1t} = \frac{k_{2t}}{k_{1t} + k_{2t}} \Delta u_t,$$

$$\dot{s}_{2t} = -\frac{k_{1t}}{k_{1t} + k_{2t}} \Delta u_t, \text{ and } s_{it} \leq \frac{\mu F_n}{k_{it}}$$

Both Non-Zero and Zero Dampers

For contacts that have a mix of non-zero and zero dampers, the equations are combinations of the two cases cited above. For example, for the case of $c_{1n} = c_{2t} = 0$ and $c_{2n}, c_{2t} \neq 0$, the model is:

$$F_n = -b_n = -k_{1n} s_{1n}, \quad \dot{s}_{1n} = \Delta u_n - \frac{1}{c_{2n}} (k_{1n} s_{1n} + k_{2n} s_{2n}),$$

$$\dot{s}_{2n} = -\frac{1}{c_{2n}} (k_{1n} s_{1n} + k_{2n} s_{2n})$$

$$F_t = -k_{1t} s_{1t} = k_{2t} s_{2t} + c_{2t} \dot{s}_{2t} \quad \text{subject to} \quad F_t \leq \mu F_n$$

$$\dot{s}_{1t} = \Delta u_t - \frac{1}{c_{2t}} (k_{1t} s_{1t} + k_{2t} s_{2t}),$$

$$\dot{s}_{2t} = -\frac{1}{c_{2t}} (k_{1t} s_{1t} + k_{2t} s_{2t})$$

Now we tackle the issue of tuning our model parameters, the spring and damper constants, to reflect material behavior.

SPECIFYING MATERIAL PARAMETERS

The constituting elements of our model simulate specific object responses during contact. Their values can also be set to 'match' certain material properties of the interacting objects. Springs (elastic elements) keep the bodies from interpenetrating, and accomplish momentum transfer through absorption and release of kinetic energy. They also model the 'elastic feel', i.e. the hardness or the softness of the material, and can be compared to the Young's modulus for the material see Y. C. Fung, *Foundation of Solid Mechanics*, Prentic Hall, 1965. Energy dissipation is accomplished through dampers and friction. The damper constants can be related to the coefficient of restitution or the energy loss that occurs during an impact.

Spring Constants

All objects in our simulation are modeled as 'hard' rigid objects. Hence spring stiffnesses are set quite high. In particular, normal spring stiffnesses $k_n$ are based on permissible deformation and the required energy absorption capacity. If $E_{max}$ is the energy to be stored for a spring deflection of $\delta_{max}$, then energy balance gives, $$k_n = \frac{2E_{max}}{\delta_{max}^2} \tag{28}$$

$E_{max}$ is the maximum kinetic energy that the body can have and is determined by its mass (m) and maximum velocity ($v_{max}$) as $$E_{max} = \frac{1}{2} m v_{max}^2.$$

The allowable spring deflection $\delta_{max}$ is set to be a small fraction of some representative linear dimension (average dimension) of the object. Small spring deflections are desirable for geometric reasons: they lead to robust geometric contact analysis algorithms and a realistic visual perception of interacting rigid bodies in the displayed animations.

In the interests of isotropy, $k_t$ is set to equal $k_n$, although it can just as easily be set to a different value. Setting damper constants is a bit more involved.

Damper Constants

Even in the absence of friction, energy loss during impact is difficult to quantify simply. It is a complex function of material properties, geometry of contact, duration of impact, etc. Traditionally, a non-zero coefficient of restitution $e_r$ is used to account for energy lost during impact see R. M. Brach, *Mechanical Impact Dynamics*, John Wiley, New York, 1991. For setting the normal damper constant $c_n$ to achieve a desired energy loss for a material, one can consider an experiment involving a frictionless impact between a sphere of mass m falling on a stationary horizontal plate made of the same material. Since the sphere and plate have identical material properties, their interaction is equivalent to the single spring-mass-damper system of FIG. 9. The single spring and damper shown in that Figure have half the stiffness and damping of the actual material. If $v_a$ is the velocity of the sphere after impact and $v_b$ before impact, then the energy retained during impact, $E_r$, and the coefficient of restitution, $e_r$, are related as, $$E_r = \frac{\frac{1}{2} m v_a^2}{\frac{1}{2} m v_b^2} = \frac{v_a^2}{v_b^2} = e_r^2 \tag{29}$$

Figure 9:
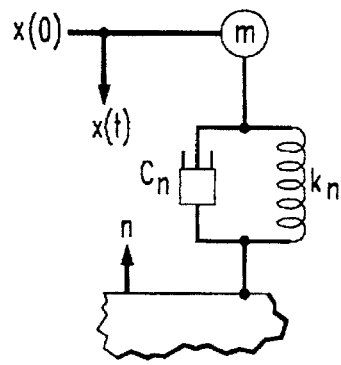
FIG. 9 is a diagram of a single spring-mass-damper system.

Referring to FIG. 9, if $x(t)$ is the displacement of the sphere from the equilibrium position of the normal contact spring, then it feels a force $F = -c_n \dot{x} - k_n x$. Its equation of motion is:

$$m\ddot{x} + c_n\dot{x} + k_n x = 0 \tag{30}$$

With natural frequency $$\omega_n = \sqrt{\frac{k_n}{m}},$$

damping ratio $$\zeta = \frac{c_n}{2m\omega_n} \quad (0 \leq \zeta \leq 1),$$

and $\omega_d = \omega_n \sqrt{1-\zeta^2}$, the solution to equation (30) is $$x(t) = \frac{v_b}{\omega_d} e^{-\zeta\omega_n t} \sin(\omega_d t).$$

Contact between the sphere and plate is broken when $F(t)=0$. This occurs at time $t^*$ such that $$\tan(\omega_d t^*) = -\frac{2\zeta\sqrt{1-\zeta^2}}{1-2\zeta^2}, \; E_r = e^{-2\zeta\omega_n t^*} \Rightarrow t^* = \frac{\ln(E_r)}{-2\zeta\omega_n} \tag{31}$$

Manipulation of equation (31) gives $$\ln(E_r) = -\frac{4\zeta}{\sqrt{1-\zeta^2}} \tan^{-1}\left(\frac{\sqrt{1-\zeta^2}}{\zeta}\right) \tag{32}$$

Figure 10:
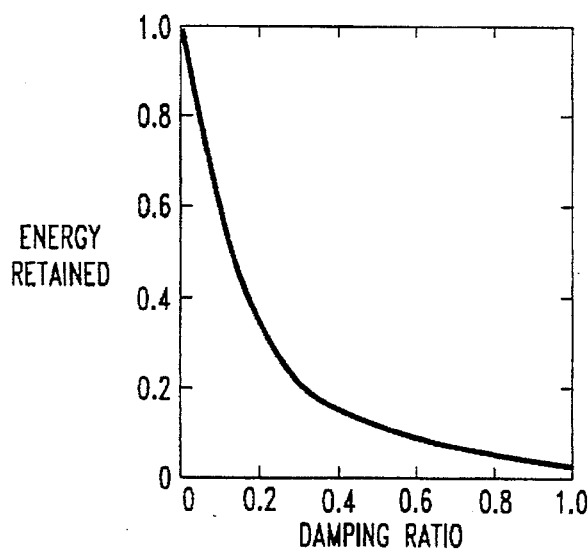
FIG. 10 is a graph of the energy retained versus the damping ratio for tuning the normal damper.

The transcendental equation (32) can be solved, numerically, for $c_n$. Equation (32) is plotted in FIG. 10. It shows that $\zeta = c_n = 0$ gives a completely elastic impact, i.e., $E_r = 1$ and there is no dissipation of energy. However, $\zeta = 1.0$ does not yield the expected plastic impact where the bodies do not separate after impact (i.e., $v_a = 0$). This is because we break contact at $F(t)=0$; with non-zero $k_n$ and $c_n$, this always occurs with $v_a > 0$. In fact, equation (32) shows that, $$\lim_{\zeta \to 1} \ln(E_r) = -4, \text{ or } E_r \approx 0.01832.$$

A truly plastic impact, if desired, can be obtained by setting $k_n = 0$ and with high damping.

The tangential damper $c_t$, along with friction, damps energy in the $P_t$ plane. Its primary function is to damp out frictional oscillations. Hence it is either set from the energy analysis of equation (32) or to the critical damping value of $\sqrt{4mk_t}$ for shortest time to attain equilibrium in the $P_t$ plane.

It is important to note, however, that the preceding energy loss analysis is limited to the idealized impact shown in FIG. 9. In a generalized 3-D impact, actual energy loss in the simulation is a complicated function of several factors: the normal and tangential damper constants of both the contacting bodies, their effective masses at the point of contact, and the coefficient of friction. Effective mass is a function of geometry and inertia distribution and can change even during the contact episode due to relative rotation of the contacting bodies. Due to all these complex factors, a simple expression for energy loss at impact in terms of spring and damper constants is usually not possible.

ESTIMATING AND CONTROLLING THE TIME RESPONSE OF CONTACT BEHAVIOR

Spring-mass-damper systems, like that of FIG. 9, have natural frequencies associated with their response. Meaningful numerical integration requires that the time-step of integration $\Delta t$ be several times smaller than the smallest time period $\tau_{min}$ (or time constant) associated with these natural frequencies.

Among other things, these time constants depend on the ratio of effective masses to material stiffnesses for each body. The minimum effective mass $m_{min}$ for a body, depending upon its geometry, can become extremely small. Material stiffnesses are usually quite high because we model the bodies as hard rigid objects. These two factors can lead to an arbitrarily small $\tau_{min}$, requiring an even smaller $\Delta t$ for stable integration. Very small time steps are undesirable for two reasons. First, program solution speed is affected adversely because smaller time steps require more steps in the simulation and hence more computation. Secondly, very small time steps can lead to a destabilizing accrual in round off errors in numerical computations.

To address these problems we limit the minimum allowed time step ($\Delta t_{min}$) and suppress behavior that cannot be integrated meaningfully with it. Non-integrable high frequency model response is suppressed by altering appropriate model parameters. Broadly, there are two types of time constants that we check for: those that are associated independently with the material for each body and time constants that arise due to interaction between materials.

Time Constants Associated With Each Body

Based on the material model that, we implement for contact, each body has a set of two spring-mass-damper systems—one in the $P_t$ plane and the other along n. The response of the spring-mass-damper system is governed by two time constants, $$\frac{1}{\zeta \omega_n} \text{ and } \frac{2\pi}{\omega_n}.$$

In terms of material stiffnesses and minimum effective masses $m_{min}$, they are $$\tau = 2\pi \sqrt{\frac{m_{min}}{k}} \text{ and } \tau = 2\frac{m_{min}}{c}.$$

The program checks to see that $\Delta t_{min}$ is less than these $\tau$'s for $k=k_n$, $K=k_t$, $c=c_n$ and $c=c_t$. If $\Delta t_{min}$ is greater in any of these cases, the corresponding stiffness/damping is decreased appropriately. However, the actual time constants that the integrator experiences are the pairwise material interaction time constants at contact, as described below.

Time Constants at Contact

The contact models of FIGS. 6 and 8, either along n or in the $P_t$ plane, can be analyzed as an interacting system of two pairs of spring-mass-dampers (see FIG. 6). The equation of motion for such a system can be obtained as a third order linear differential equation. When contact is made the characteristic equation associated with this differential equation can be solved numerically to estimate its time constants. However, if the stiffnesses and masses of the contacting bodies are comparable, then most of the time constants for the contact model are close to the time constants estimated for the individual bodies, as obtained above.

Figure 11:
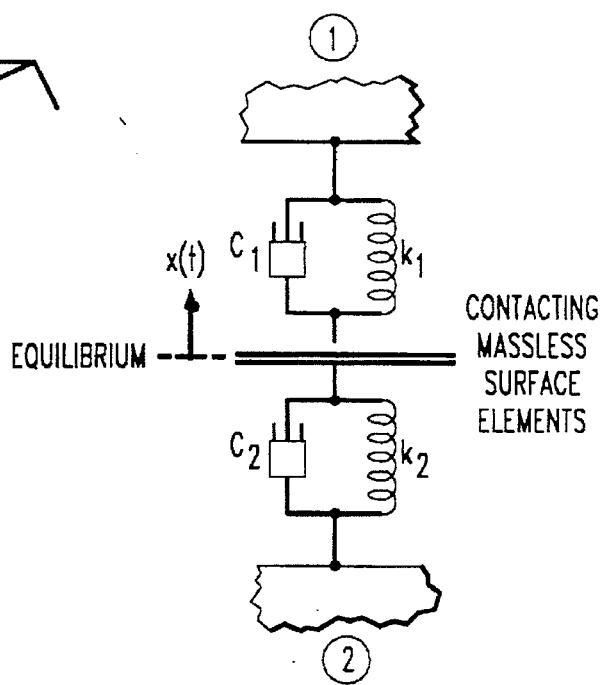
FIG. 11 is a diagram showing how the response of contacting surface elements may be analyzed.

One of the time constants also involves the response of the massless contacting surface elements when subjected to the spring and damper forces from both bodies, and it can be obtained as the response of the elements shown in FIG. 11. If x(t) is the displacement of the contacting surface elements from their equilibrium position then their equation of motion is given by $$(c_1+c_2)\dot{x}+(k_1+k_2)x=0 \tag{33}$$

It should be noted that since the contacting surface elements are massless they should always be at their equilibrium position, but numerical discretization can lead to drift from this position. The solution to equation 33 is an exponential decay which has the form $$x(t) = x(0) e^{-\frac{t}{\tau}}, \tau = \frac{c_1+c_2}{k_1+k_2} \tag{34}$$

Our software system checks to make sure that $\Delta t_{min}$ is less than $\tau$, both along n and in the $P_t$ plane. If $\Delta t_{min} > \tau$ in the normal direction, we set the normal dampers to be zero ($c_{1n}=c_{2n}=0$). If the same holds true in the $P_t$ plane, we decrease the tangential stiffnesses ($k_{1t}$ and $k_{2t}$) of the contact model appropriately. Incidentally these corrections can lead to a substantial difference in the outcome of impacts involving marginally damped material (from the expected outcome in terms of energy loss) because the low damping specified for the materials in the normal direction jumps to zero damping, implying elastic material. And low damping specified in the tangential direction can jump to much higher effective damping when the corresponding stiffnesses are reduced. The above analysis does not apply, and is not necessary, for the damperless case. Besides estimating and controlling the time response at contact our integration scheme performs some additional adjustments to achieve and enhance numerical stability, as described below.

ADDITIONAL ADJUSTMENTS FOR NUMERICAL STABILITY

Finite precision dictates that non-zero thresholds be set for deciding different cases, for instance choosing between an elastic and a damped impact for very small damper values. Contact springs are 'adjusted' at the end of every time step. The normal and tangential springs are realigned to lie along the updated n and $P_t$ plane respectively. In addition, the direction of the tangential springs is made parallel to the direction of slip between the bodies and their magnitude kept within the friction cone.

Throughout the integration, normal contact springs are never allowed to have tensile deformation. In addition, the integration time-step is refined adaptively for several causes: reversal in spring deformation directions, 'zero crossings' of tangential springs, velocity reversals, etc.

THE GEOMETRY MODULE OBJECT REPRESENTATION

The major geometric computation addresses the question of exactly where bodies make contact. Here a representation decision must be made, since determining spatial relationships depends on exactly how the objects are represented geometrically. The representation we have chosen is that of convex polyhedra. This restricts the complexity of objects that can be simulated for two reasons. First, some objects one might want to include in a simulation are not convex. Second, smoothly continuous surfaces, such as spheres and cylinders, cannot be represented exactly. Smooth surfaces can be approximated closely if desired, by using large numbers of faces in the polyhedron. Issues of computational performance limit the number of faces that can be used in a practical application. However, in favor of polyhedral representations is the fact that most geometric calculations only require solutions of linear equations. Since similar computations are required for all faces (or all edges or all vertices) of an object, many similar simple computations are performed. In principle, this leads to a form of problem that is well suited for solution by massively parallel computers. Advances in computer architecture and VLSI processing speeds that will occur during the next few years can be expected to result in real time simulation capabilities for many problems of interest.

Before contact analysis begins, the geometry module computes the invarient inertial properties (masses and moments of inertia) of the convex polyhedra in the simulation, based on their geometries. During the simulation, a detailed description of the body's shape and location, is used to determine when and where contacts occurred. The location of an object specifies all six of its degrees of freedom: 3 Cartesian coordinates for its center of mass, and 3 orientation angles.

THE INTEGRATION/CONTACT-ANALYSIS LOOP

Integrating the equations of motion is an initial value problem. (FIG. 12 explains the computational flow of contact analysis as it supplements this integration.) As shown in flowchart 1201, from the known system-state at time $t_0$, we integrate forward to time $t_1=t_0+dt$. If the integration step is valid, we now have the system-state at $t_1$, and the process can be repeated. The system state at time $t_0$ has two components: the dynamic-state, $D_0$, and the contact-state, $C_0$. $D_0$ specifies the positions and velocities (both linear and rotational) of all objects at $t_0$. $C_0$ specifies the state of each contact that exists at $t_0$ including, for each contact, which objects are involved and the exact state of the contact (e.g., the edges and vertices involved, and the location and status of the contact). The contact-state is represented by a list 125 of contact-blocks, 127, each specifying the above information for one contact. Based on $C_0$, the dynamic equations, $E_0$, at time $t_0$ can be specified including all active inter-object spring and damper forces. We now integrate forward, using $E_0$, to time $t_1$. The result at $t_1$ will be a new dynamic-state, $D_1$, and a corresponding new contact-state, $C_1$. Contact analysis at $t_1$ determines $C_1$, which can then be compared with $C_0$. If the set of contacts $C_1$ and $C_0$ are the same, then no change in contact-state occurred, so $C_1$ and $D_1$ can be accepted as valid starting points for the next integration step (inner loop 1203 shown in FIG. 12.

On the other hand, if $C_1$ and $C_0$ differ in the set of contacts they contain, then either a new contact appeared or an existing contact disappeared (i.e., was broken) during the integration interval. Broken contacts are normally determined by the dynamics module based on when the normal force acting at the contact goes to zero. For certain exception conditions described later, geometric conditions must be used to determine broken contacts. Such an event is easily handled by removing the corresponding contact-block from the contact-list 125. New contacts, however, have to be analyzed in detail. In particular, the earliest new contact event during the dt interval is determined. Assuming this contact occurs at some fraction $\delta$ of the whole interval ($0 \leq \delta \leq 1$), we can integrate forward to time $t_c=t_0+\delta.dt$. The resulting dynamic-state, $D_c$, and contact-state, $C_c$, at $t_c$ can be accepted as valid starting points for the next integration step, since no contact event occurred during the interval $t_0 \leq t \leq t_c$ (outer loop 1205 shown in FIG. 12).

All contacts between the polyhedra must be identified and tracked. At every time step, the geometry module accomplishes this through contact analysis. Contact analysis consists of interference detection (detecting whether objects are in contact) and maintaining the interference information in a list of active point contacts (the contact state), that the dynamics module uses to calculate contact forces.

INTERFERENCE DETECTION

The interference detection algorithm looks for a separating plane that partitions space with all vertices of one object (say, object A on one side of the separating plane and all vertices of the other object (say, object B on the other side of the plane. Each edge of A is examined in turn to see if it supports such a separating plane, i.e., if there is a plane that contains the edge and that is a separating plane. As soon as such a plane is found, the algorithm terminates and reports success. If no separating plane is supported by any edge of A, the process is repeated, but this time looking for a separating plane supported by an edge of B. Again, success is reported as soon as such an edge is found. If no such edge is found, the algorithm reports failure, i.e., that the objects interfere with each other.

Since each edge is considered in turn, and for each edge all vertices of the other object are considered, the algorithm is of complexity $O(n^2)$ in the number of vertices of the objects involved. For convex polyhedra, the number of object edges E, faces F and vertices V are related linearly by $E=F+V-2$, so n can be used generically to represent the number of edges, faces or vertices in complexity expressions. In principle, each possible pair of objects in the scene must be examined. Again, this requires $O(K^2)$ comparisons, where k is the number of objects in the scene. The overall complexity is the product of these two complexity results, or $O(N^2)$ comparisons, where N is the total number of vertices in all objects being considered.

Fortunately, it is possible to reduce the amount of computation required for interference detection substantially. First, objects are divided into two classes: moving or fixed. Fixed objects are used to represent stationary obstacles in the simulation space or walls bounding the possible motion of objects. Interference computations are not needed between fixed objects. Only moving-moving and moving-fixed object comparisons are made. Second, very fast bounding-box screening tests are performed on candidate object pairs before detailed interference calculations are undertaken. These tests look for separating planes that are orthogonal to the World Coordinate reference frame axes. Since bounding box extents are stored in the data structure representing an object's geometry, these tests are done in constant time for each object pair, independent of the number of vertices. The bounding box extents must be updated for every moving object at each time step, an amount of computation that grows only linearly with the number of objects. The number of bounding box tests still grows as the square of the number of moving objects. The relatively expensive separating plane test is only performed on the smaller number of object pairs not eliminated by the bounding-box test.

DETERMINING THE CONTACT STATE

Interference detection (often called collision detection) is computationally the most expensive part of contact analysis, but much of the useful information for the force model is obtained by determining the contact state. Interesting new problems arise in the context of generating and updating the contact state.

Many pairs of objects may be in contact simultaneously, and an object may be involved in several contacts simultaneously, either with one or several other objects. For example, as shown in FIG. 4, a FF contact between two cubes will appear as four VF contacts if all the contacting face vertices of the smaller cube lie within the contacted face of the larger cube. Or, such a contact may appear as two VF contacts and two EE contacts if the contacting face of the smaller cube extends past an edge of the face of the larger cube. Each such VF or EE contact is identified by its contact-id, which is a unique 6-tuple of information:

1. The index of the first object, say object A, among all possible objects.
2. The index of the second object, say object B, among all possible objects.
3. The type of the contacting element of A--F (Face), V (Vertex) or E (Edge).
4. The type of the contacting element of B--F (Face), V (Vertex) or E (Edge).
5. The index of the contacting element among all elements of that type in A.
6. The index of the contacting element among all elements of that type in B.

Information describing each contact is stored in a contact block 127. Contact-block 127 contains the contact-id and additional information about the contact, including:

1. The location of the point of contact.
2. The direction along which the normal impact force acts. For VF contacts, this is the direction of the normal to the contacted face. For EE contacts, this direction is obtained by taking the cross product of the two edge-vectors involved.

3. The type of the contact: new if initial contact occurred after the beginning of the previous integration step; or continuing if the contact existed at the beginning of the previous integration step.

The contact-state of the system consists of a list 125 of contact-blocks 127 one for each active contact in the system, ordered by contact-id. To maintain the contact state in contact list 125, it is necessary to determine when a contact first occurs (initial-contact) and when it ends (broken-contact), i.e., when the two objects separate at that specific contact. These occurrences are known as contact-events. Initial-contacts are determined by purely geometric considerations. When an initial-contact occurs, a new contact-block 127 is added to contact list 125. Broken-contacts are determined and deleted from contact list 125 based on either dynamic or geometric considerations, as explained later.

Determining Initial Contacts

When two objects approach each other and their motion is approximated by integration with a finite time step, actual contact will, in general, occur sometime during the integration interval. Since the behavior of the contacting objects can be extremely sensitive to exactly when and where each contact occurs, it is essential to approximate the time and position of initial contact accurately. This could be done by an iterative process such as time-halving the integration steps. Unfortunately, such trial and error approaches can require many iterations to reach an acceptably accurate result.

Figure 13A:
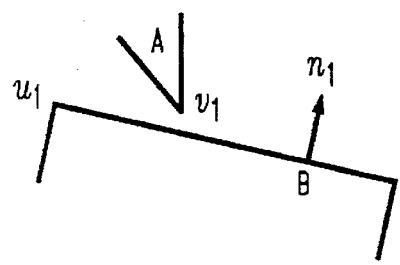
FIG. 13 shows how interpolation is used to determine the time and location of a vertex-face contact.
Figure 13B:
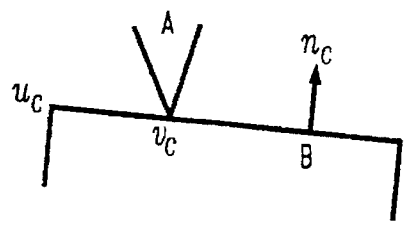
Figure 13C:
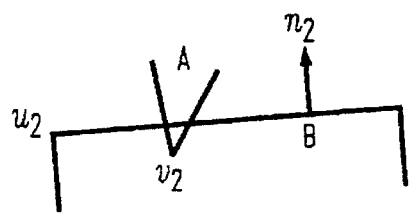

To reduce the amount of computation, we replace iteration by interpolation. Consider the case of a VF contact where vertex v of object A strikes the face of object B whose normal points in the direction n, as shown in FIG. 13. At the start of the integration step, time $t_1$ (FIG. 13(a)), the objects do not interfere, v is at location $v_1$ and face F is at location $F_1$ with face normal $n_1$. At time $t_2$ (FIG. 13(c)), the end of the proposed integration interval, v has penetrated F, and the corresponding quantities are $v_2$, $F_2$ and $n_2$. At some intermediate time $t_c$ (FIG. 13(b)), the objects must have experienced initial contact, with v, F and n assuming values of $v_c$, $F_c$ and $n_c$. Contact analysis then determines $t_c$ through linear interpolation. The method used for linear interpolation is the following:

We know the positions of objects A and B at times $t_1$ and $t_2$, the start and proposed end of an integration interval, respectively. Therefore $n_1$, $n_2$, $v_1$ and $v_2$ are known. Furthermore, we know the positions of a specific point on the penetrated face, say one of the vertices of the face polygon. Let this point be located at $u_1$ at time $t_1$, and at $u_2$ at time $t_2$. We assume that v and u translate linearly, and n rotates linearly between $t_1$ and $t_2$, a reasonable approximation if the time interval $t_2-t_1$ is small. Then v, n and u can each be expressed in terms of a linear interpolation parameter t, ($0 \leq t \leq 1$):

$$v=(1-t)v_1+tv_2, \; n=(1-t)n_1+tn_2, \; u=(1-t)u_1+tu_2 \quad (35)$$

The equation stating that at contact the vertex must lie exactly on the face is n·v=n·u. Substituting from equation 35 leads to the following quadratic equation in t:

$$at^2+bt+c=0 \quad (36)$$

where $$a=(n_2-n_1)\cdot[(v_2-v_1)-(u_2-u_1)]$$

$$b=(n_2-n_1)\cdot(v_1-u_1)+n_1\cdot[(v_2-v_1)-(u_2-u_1)]$$

$$c=n_1\cdot(v_1-u_1)$$

Equation (36) is easily solved for t. When the time interval $t_2-t_1$ is small, exactly one of the two solutions lies in the range $0 \leq t \leq 1$. Note that if the penetrated body does not rotate $n_2=n_1$, so a=0 and 19 reduces to an even more easily solved linear equation in t.

Interpolation is also used to determine the time and location of EE contacts. The computation is performed in a coordinate system in which one object, say object B, remains fixed, and only object A moves. After solving for the time and location of initial contact in this coordinate system, the location is transformed to its proper value in the World Coordinate system. The method uses Homogeneous Transforms (HTs) as explained below.

HTs are used in the geometry module to specify object locations and orientations. An HT is a 4×4 matrix which includes a 3×3 rotation matrix and a 3×1 spatial displacement. The effect of applying (pre-multiplying) the transform to any point is to rotate the point about the coordinate system origin as specified by the rotation matrix, followed by translating the point as specified by the spatial displacement. Each object is initially defined in its own local reference frame whose origin is at the object's geometric center. At every integration time step, an HT is known for each object that takes it to its correct spatial location. In terms of HTs, the following method converts the location of object A from its location before interference to its equivalent location in a coordinate system where object B remains fixed at its post-interference location.

Let $R_1$ and $R_2$ be HTs that position object A just before (time $t_1$) and just after (time $t_2$) interfering with object B, respectively. Let $S_1$ and $S_2$ be HTs that position object B at times $t_1$ and $t_2$, respectively. Then $S_2$ is used to position B, which remains fixed; $R_2$ is used to position A at $t_2$; and $R_0=S_2 S_1^{-1} R_1$ is used to position A at $t_1$.

Figure 14:
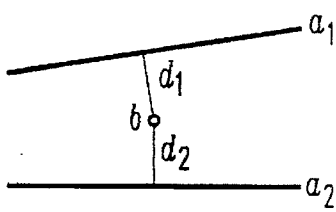
FIG. 14 shows how an edge-edge contact is determined.

The computation in the fixed coordinate system is illustrated in FIG. 14, where edge b is the fixed edge of object B, while edge a of object A moves from location $a_1$ at time $t_1$ to $a_2$ at time $t_2$. Again, it is assumed that motions during this small time interval are linear (i.e., uniform translation and rotation during the time interval). Since the equations for edge a are known at times $t_1$ and $t_2$, it is easy to solve for $d_1$ and $d_2$, the distances between a and b at $t_1$ and $t_2$, respectively. It is also straightforward to compute $p_1$ and $p_2$, the points on b that are closest to $a_1$ and $a_2$, respectively. The time of contact, $t_c$, and point of contact on b, $p_c$, are then determined by linear interpolation to be:

$$t_c = \frac{d_1}{d_1+d_2}, \; p_c=(1-t_c)p_1+t_c p_2 \quad (37)$$

Knowing $t_c$, linear interpolation can be applied to the HTs to obtain $R_c$ and $S_c$, the transforms for A and B, respectively, at the time of contact. Linear interpolation between two HTs involves independent interpolation of the displacement and rotation components. Assume the initial and end times are normalized to 0 and 1, respectively. Let $x_0$ and $Q_0$ be the displacement and rotation components at t=0, $x_1$ and $Q_1$ be the displacement and rotation components at t=1, $x_c$ and $Q_c$ be the interpolated displacement rotation at the time of contact, $t_c$ ($0 \leq t_c \leq 1$), and q be the incremental rotation between $Q_0$ and $Q_1$, i.e. $q=Q_1 Q_0^{-1}$.

For interpolation purposes, we interpret q to be a rotation by an angle θ about a fixed axis v, which we can express as rot(v, θ). The displacement $x_c$ and rotation $q_c$ at contact are just $$x_c=(1-t_c)x_0+t_cx_1, \quad q_c=\text{rot}(v,t_c\theta) \tag{38}$$

Tracking Contacts

Contacts must be tracked, i.e., their positions and orientations must be determined, through several (possibly many) integration steps for two reasons. First, even during impacts where bodies rapidly bounce off each other, the contact model requires several time steps to stably integrate the rapidly evolving forces. Second, contacts of extended duration will occur when bodies slide along each other. The integration time step is automatically adjusted to a small value upon encountering a new contact. The dynamics integrator then gradually increases the time step within the limits of accuracy constraints.

VF and EE contacts are tracked differently. VF contacts are tracked by the dynamics module. The vertex position and face normal vector involved in a VF contact are reported to the dynamics module in a new contact-block 127 when the contact is first detected. At $t_0$, the time at which the new contact occurred, the following information is known:

- $R_{v0}$ rotation specifying the orientation of the object whose vertex is involved in the contact (current state 123 at $t_0$)
- $r_0$ location of the center of mass of the above object (from current state 123 at $t_0$)
- $v_0$ location of the contacting vertex (from the contact-block 127 at $t_0$)
- $R_{f0}$ rotation specifying the orientation of the object whose face is involved in the contact (from current state 123 at $t_0$)
- $n_0$ normal to the contacted face (from contact-block 127 at $t_0$).

The dynamics module can independently determine the contacting vertex position and face normal orientation at any subsequent time $t_1$. Using object rotation $R_{v1}$ and $R_{f1}$ and center of mass $r_1$, which are known from the dynamic-state at $t_1$, the vertex position $v_1$ and face normal $n_1$ at $t_1$ are:

$$v_1 = r_1 + R_{v1}R_{v0}^{-1}(v_0 - r_0) \tag{39a}$$

$$n_1 = R_{f1}R_{f0}^{-1}n_0 \tag{39b}$$

EE contacts are tracked by the geometry module. This is necessary because the contact location can occur anywhere along the edges involved, and the dynamics module has no information about the internal geometry of objects. As in the VF case, the two edges involved are reported in the contact block 127 generated when the contact is first detected. Subsequently, as long as the contact is in effect, the geometry module determines the location on each edge that is closest to the other edge. The point halfway between these two locations is taken as the point of contact. The contact normal is formed by taking the cross product of the two edge direction vectors. The signs are selected so that each normal points away from its object.

Special Cases During Contact Analysis

Special situations arise during contact analysis that have to be recognized and afforded special treatment. They occur for two reasons: first, because of the interpolation technique used to determine initial contact locations; and second, because of the polyhedral representation used, which can result in exceptional relationships between the vertices and edges of pairs of objects.

Virtual Contacts due to Interpolation

Figure 15A:
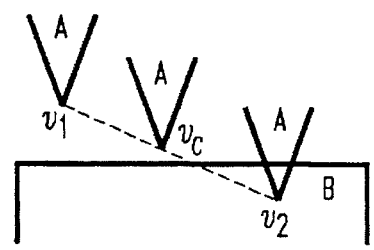
FIG. 15 shows special contact analysis cases.

Virtual contacts are contacts that must be included in the contact state even though there is actually no interference between the objects involved. They can arise when the location of an initial contact is determined by linear interpolation, as shown in FIG. 15(a). The system is integrated forward by the current integration time step, dt, from $t_1$ to $t_2$. At $t_1$, with the vertex at $v_1$, there is no interference between objects A and B. At $t_2$, with the vertex at $v_2$, there is interference. Linear interpolation predicts motion along the dotted line, resulting in a predicted initial contact at time $t_c$ ($t_1 \leq t_c \leq t_2$). The equations of motion are now integrated forward to $t_c$, with the vertex reaching position $v_c$. It is possible, however, that we have backed up too far, and no interference occurs at $t_c$, as shown in FIG. 15(a). Nonetheless, we assume that the one-step interpolation technique achieved sufficient accuracy and include the contact as a new contact in the contact state of contact list 125, $C_c$, at time $t_c$. The contact is treated as if initial contact occurred at the interpolated position. The virtual contact remains in the contact-list 125 at subsequent times as a continuing contact as long as the spring-damper force for the contact remains positive (compressive).

Maintaining Face Continuity in a VF Contact

Figure 15B:
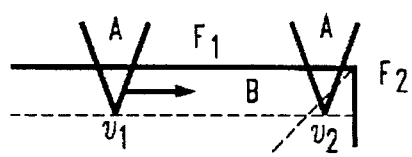

Consider a continuing contact in which vertex v of object A slides along face $F_1$ of object B. As shown in FIG. 15(b), the penetrating vertex is located at $v_1$ at time $t_1$, and moves along the dotted line to location $v_2$ at time $t_2$. At $t_1$, v is unambiguously closest to face $F_1$. If the sliding persists long enough, the vertex will eventually cross the plane that bisects the angle between faces $F_1$ and $F_2$ (represented by the dotted angle bisector), reaching a location such as $v_2$. At this point, v is closer to $F_2$ than to $F_1$, which would normally be reported as a contact between v and $F_2$.

This error is avoided by requiring that a contacting vertex remain in contact with the same face of the contacted object for the entire duration of a continuing contact. Whenever a vertex v is found to penetrate an object in a new dynamic state, the previously accepted contact-list 125 is scanned for an occurrence of a contact involving v. If the vertex is found, the object it is in contact with is determined. If the old contacted object is the same as the new contacted object, the new penetrated face is taken to be the same face that was penetrated in the old contact.

Breaking Contacts When an Edge is Crossed.

Figure 15C:
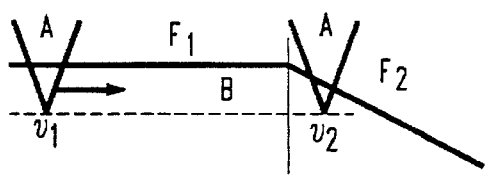

Normally, a contact is broken when the dynamics module reports a zero or negative (tensile) inter-object normal contact force. A negative force would imply an attractive rather than repulsive, interaction, which is a physical impossibility. For continuing contacts, however, a geometric condition requiring that the contact be broken may occur before the contact force condition is satisfied. Specifically, for a VF contact, the vertex crossing an edge of the contacted face's polygonal boundary implies that it is no longer in contact with the face. FIG. 15(c) shows how this happens for a VF contact. Vertex v of object A is stably sliding along face $F_1$ of object B, starting at location $v_1$ at time $t_1$. It has penetrated B to the depth of the dotted line, thereby producing an upward contact force that exactly balances the downward gravity force. At time $t_2$ it reaches the location $v_2$, which is beyond the perimeter of $F_1$'s face polygon. Clearly, v can no longer be in contact with $F_1$. Therefore, a VF contact is broken for geometric reasons if the contacting vertex, when projected normally onto the plane containing the contacted face, does not lie inside the face polygon.

A similar geometric condition may have to be used to break an EE contact for geometric reasons. Consider each edge to be a finite segment along an infinite line vector. Next consider the line segment that joins the two infinite lines that is mutually perpendicular to both of them (i.e., it joins the closest points on each of the infinite lines). It intersects the infinite line segments containing edges $E_1$ and $E_2$ at points $u_1$ and $u_2$, respectively. The geometric condition for breaking the EE contact is that $u_1$ lies outside the finite extent of edge $E_1$, or that $u_2$ lies outside the finite extent of edge $E_2$.

MODELLING SYSTEM ENVIRONMENT

The modelling system is implemented using a Silicon Graphics Power Series® 4D/340 system with a 33 mhz MIPS3000® microprocessor for standard mathematical computing, and high performance custom VLSI processors for graphics processing as processor 113. Modelling program 117 is implemented in the C programming language and runs in a standard Unix® operating system environment.

The program is initialized from an input file 131 that contains the simulated objects' geometries, their initial positions and velocities, material properties, and other parameters that control the simulation such as time step, integration error tolerance, etc. Unspecified parameters receive default values.

INPUT FILE AND PROGRAM INITIALIZATION

The essential contents of input file 131 are object geometries. An object's geometry is defined by object definition primitives, such as cube or prism. Objects are defined in a body centered coordinate system whose origin is at the object's geometric center. The axis of symmetry for prism type objects is always the z axis. A primitive object has a 1 meter extent along the x and z axes, and a known extent (exactly or approximately 1 meter, depending on the specific object definition) along the y axis. Additional parameters of the object primitive specify 3 scale factors that size the object along the x, y and z axes. For example, the command prism block red 6 0.25 0.50 0.75 defines a right rectangular prism named 'block' whose color is red. The bottom and top faces are polygons orthogonal to the z axis. The first of the four numerical parameters specifies the number of edges, 6 in this case, in the bottom and top polygons. The next three parameters are x, y and z scale factors for sizing the object. Each object's initial position and velocity are specified using the loc and commands. For example, loc x y z θ u v w positions the body with it's center of mass at (x,y,z) in the world coordinate system, and rotates the body by θ degrees about the vector (u,v,w), and vel x y z θ u v w gives the body an initial linear velocity of (x,y,z) (meters/second) and an initial angular velocity of θ (degrees/second) about the body fixed axis (u,v,w)

Inertial properties are computed automatically from the shape and dimensions specified for each object. Objects are assumed to be of uniform density which, by default, is that of water ($10^3$ kg/m$^3$). A different density can be set using the spgrav command. Exact values for inertial properties are computed for non-tapered polyhedra. For tapered objects, an approximation is used to simplify the calculation. The inertial properties computed are those of the truncated elliptical cone that circumscribes the defined polyhedron and has the same height (z dimension) as the tapered prism.

An object's material properties affect the contact forces that occur when it interacts with other objects. The mu command sets a body's base coefficient of friction. Since the coefficient of friction used in Coulomb's law really applies to an interaction between two bodies, the actual μ used at a contact is the geometric mean of the two bodies' individual base coefficients of friction. The kn, kt, cn and ct commands set, respectively, the normal and tangential spring constants and the normal and tangential damper coefficients associated with an object's surface elements. Integration control parameters specified in the input control file include an error tolerance parameter, an initial time step, and minimum and maximum time step limits. During initialization, the minimum time step is checked against the time constants of the object's surface elements. If necessary, appropriate changes are automatically made to the object's material parameters to make the surface element time constant sufficiently larger than the minimum integration step. During the simulation, an adaptive fourth order Runga-Kutta integration scheme controls the time step.

INTERACTIVE VISUALIZATION

Results are visualized through interactive animated display 107 on terminal 103. The animation can be automatically recorded on video tape, if desired. The visualization is based on a system that was developed previously for displaying simulated robot manipulators. Objects can be displayed with solid colored surfaces illuminated by a Phong lighting model or, optionally, as wireframe models.

Results can be visualized either during simulation or later in a movie playback mode. In the latter case one can control the rate of frame display to play at various speeds, for example, in slow motion.

SYSTEM PERFORMANCE

Ideally, we would like simulations to run in 'real', i.e., at the same rate that events occur in the physical world. The integration time steps we use range from about 0.01 ms (when objects are in contact) to 1 ms (when there are no contacts). This means that for real time performance the system must perform calculations for 1,000 to 100,000 integration steps per second, including equation integration, contact analysis, and image rendering. Not surprisingly, real time performance is not achieved even for simulations involving small numbers of objects (e.g., 10 or fewer moving objects and a comparable number of fixed objects). Computation time to real time ratios are, rather, observed to be between 20:1 and 500:1 for such simulations, depending on details of the simulation.

Simulation performance is difficult to characterize simply, but three factors are dominant:

N    the total number of moving vertices;
τ    the fraction of total simulated time that objects are in contact; and
α    the number of active contacts at any time.

As we saw earlier, interference detection computations at each time step grow as $N^2$. The hierarchical test strategy used makes the computation extremely fast for well separated objects. In crowded environments (which are often of most interest), however, the detailed interference detection algorithm must be used. Additional fixed objects also increase computation. However, their effect grows only linearly, so they are inherently less of an issue than moving objects.

τ is important for two reasons. First, because the integration time step while any contact exists is typically an order of magnitude or more smaller than when no contacts are in effect. All other things being equal, this slows progress by at least a factor of 10. Second, the most complex geometric computation, contact analysis, must be performed while objects are in contact.

α is significant because it determines the amount of contact analysis computation that must be performed. When objects are bouncing off each other and impact is the dominant contact mode there are few simultaneous contacts. However, for simulations with energy loss, bodies eventually stop moving and come to rest on some supporting surface. Toward the end of such a simulation, many bodies have multiple continuing contacts with the supporting surface. Even though nothing much is happening, all of these contacts must be tracked, slowing the simulation considerably. When $\tau$ is substantial and at the same time there are many active contacts, the situation is doubly difficult. As contact activity gets large, more and more computation goes into contact analysis.

CONCLUSIONS

In the foregoing, we have disclosed to those of ordinary skill in the art how to implement a modelling system which uses a discrete version of the contact model of the theoretical discussion in a software system for simulating the dynamics of freely interacting rigid bodies, including friction.

We have shown how to estimate contact forces by modeling localized material deformation in the vicinity of contact. Implementation of the contact model involved the formulation of its discrete version, tuning of model parameters to reflect the essence of material behavior, control of these parameters to achieve stable and meaningful numerical integration, and construction of a geometry analysis subsystem to deal with issues involved in contact analysis. We have tested our system on several simulations that provide strong visual validation on its 'correctness'. Additionally, it performed very well on the Gedanken experiments detailed in the theoretical discussion.

The performance of the system has been positive, both in regard to the quality of the simulation results, in terms of the naturalness and correctness of the resulting motions, and in regard to understanding the difficulties that might arise computationally from integrating stiff differential equations that change at discrete contact events. Simulated motions are extremely realistic, and even with the current single processor workstation implementation, performance is reasonable for modest numbers of objects, requiring 20 to 500 times real time to obtain results. The interactive visualization capabilities provide a very convenient user interface with great flexibility for focusing on particular objects or particular areas of space of interest. With the movie mode playback capability, real time visualization is easily obtained, as is slow motion or fast motion playback.

Although we have disclosed the best mode presently known to us of implementing a modelling system embodying the principles of the invention, it will be clear to those of ordinary skill in the art that other implementations embodying the principles of the invention are possible. In particular, other embodiments may not require that the surface elements remain parallel to the objects and may model the behavior of the viscous deformable layer in ways different from those disclosed herein. Further, other embodiments may employ different techniques of contact analysis from those disclosed herein and may of course employ different representations of the objects and the contacts. All of this being the case, the foregoing Detailed Description is to be regarded as being in all respects exemplary and not restrictive and the scope of the invention is to be determined not from the Detailed Description, but rather from the appended claims as interpreted with the full breadth permitted by the law.

What is claimed is:

1. Improved simulation apparatus implemented in a computer system including a display for simulating an interaction of rigid bodies and displaying the simulated interaction in the display, the simulation apparatus being of the type which includes a contact mechanics component for modelling the mechanics of contacts between the rigid bodies and the improvement comprising:

a dynamics component in the contact mechanics component which models a deformation caused by a contact between one of the rigid bodies and another thereof by means of an ideal rigid massless layer covering each body at the point of contact and a viscous deformable layer between each body and its layer.

2. Improved simulation apparatus implemented in a computer system including a display for simulating an interaction of rigid bodies and displaying the simulated interaction in the display, the simulation apparatus being of the type which includes a contact mechanics component for modelling the mechanics of contacts between the rigid bodies and the improvement comprising:

a geometric contact analysis component in the contact mechanics component which models a contact between one of the rigid bodies and another thereof which is neither a vertex-face nor edge-edge contact as a combination of discrete vertex-face and/or edge-edge contacts.

3. Improved simulation apparatus implemented in a computer system including a display for simulating an interaction of rigid bodies and displaying the simulated interaction in the display, the simulation apparatus being of the type which includes a contact mechanics component for modelling the mechanics of contacts between the rigid bodies and the improvement comprising:

in the contact mechanics component, a dynamics component which models a deformation caused by a contact between one of the rigid bodies and another thereof by means of an ideal rigid massless layer covering each body at the point of contact and a viscous deformable layer between each body and its layer; and a geometric contact analysis component which models a contact between one of the rigid bodies and another thereof which is neither a vertex-face nor edge-edge contact as a combination of discrete vertex-face and/or edge-edge contacts.

4. The simulation apparatus set forth in claim 1 or claim 2 wherein the improvement further comprises:

means for modelling the rigid bodies as convex polyhedra.

5. The simulation apparatus set forth in claim 3 wherein the improvement further comprises:

means for modelling the rigid bodies as convex polyhedra.

6. The simulation apparatus set forth in claim 5 wherein:

the motion of the viscous deformable layer in the model is constrained so that planes or edges of the convex polyhedron in the ideal rigid massless layer remain parallel to the corresponding planes or edges in the body.

7. The simulation apparatus set forth in claim 6 wherein:

the viscous deformable layer is described in the model by means of springs and dampers operating normally to vertices, planes or edges and parallel to the plains or edges.

8. The simulation apparatus set forth in claim 7 wherein:

the contact behavior of a vertex, edge, or plane of the convex polyhedron is described in the model by setting constants for the springs and dampers for the vertex, edge, or plane.

9. The simulation apparatus set forth in claim 5 wherein:
the simulation apparatus further includes a dynamics component for determining the trajectories of the rigid bodies; and
when a contact occurs on a trajectory, the point of contact on the trajectory is determined by interpolation.

* * * * *